United States Patent
Chen et al.

(10) Patent No.: US 11,362,066 B2
(45) Date of Patent: Jun. 14, 2022

(54) SEMICONDUCTOR STRUCTURE AND MANUFACTURING METHOD THEREOF

(71) Applicant: Taiwan Semiconductor Manufacturing Co., Ltd., Hsinchu (TW)

(72) Inventors: Ying-Ju Chen, Yunlin County (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 132 days.

(21) Appl. No.: 16/831,776

(22) Filed: Mar. 26, 2020

(65) Prior Publication Data

US 2021/0305209 A1 Sep. 30, 2021

(51) Int. Cl.
*H01L 25/065* (2006.01)
*H01L 23/00* (2006.01)
*H01L 25/00* (2006.01)

(52) U.S. Cl.
CPC .......... *H01L 25/0657* (2013.01); *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2225/06548* (2013.01); *H01L 2225/06586* (2013.01)

(58) Field of Classification Search
CPC ................. H01L 25/0657; H01L 24/08; H01L 2225/06586; H01L 2224/08145; H01L 2224/80895; H01L 2224/80896; H01L 2225/06548; H01L 2225/06524; H01L 25/50; H01L 24/80
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |

(Continued)

*Primary Examiner* — Thanh Y. Tran
(74) *Attorney, Agent, or Firm* — JCIPRNET

(57) ABSTRACT

A semiconductor structure and the manufacturing method thereof are provided. A semiconductor structure includes a first semiconductor die, a second semiconductor die, an insulating layer, and a first dual-damascene connector electrically connected to the first semiconductor die. The first semiconductor die includes a first bonding surface including a die attaching region and a peripheral region connected to the die attaching region. The second semiconductor die is electrically connected to the first semiconductor die, and a second bonding surface of the second semiconductor die is bonded to the first bonding surface in the die attaching region. The insulating layer disposed on the first bonding surface in the peripheral region extends along sidewalls of the second semiconductor die. The first dual-damascene connector includes a first portion disposed on the insulating layer, and a second portion penetrating through the insulating layer and landing on the first bonding surface in the peripheral region.

20 Claims, 20 Drawing Sheets

(56) References Cited

U.S. PATENT DOCUMENTS

| | | |
|---|---|---|
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2020/0152608 A1* | 5/2020 | Hu ..................... H01L 23/5383 |
| 2021/0098423 A1* | 4/2021 | Chen ..................... H01L 24/08 |
| 2021/0242080 A1* | 8/2021 | Weng ..................... H01L 25/50 |

* cited by examiner

SEMICONDUCTOR STRUCTURE AND MANUFACTURING METHOD THEREOF

BACKGROUND

The semiconductor industry has experienced rapid growth due to continuous improvement in integration density of various components, e.g., transistors, diodes, resistors, capacitors, etc. For the most part, this improvement in integration density has come from successive reductions in minimum feature size, which allows more components to be integrated into a given area. Technological advances in integrated circuit (IC) design have produced generations of ICs where each generation has smaller and more complex circuit designs than the previous generation. There is continuous effort in developing new mechanisms of forming semiconductor structures having improved electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
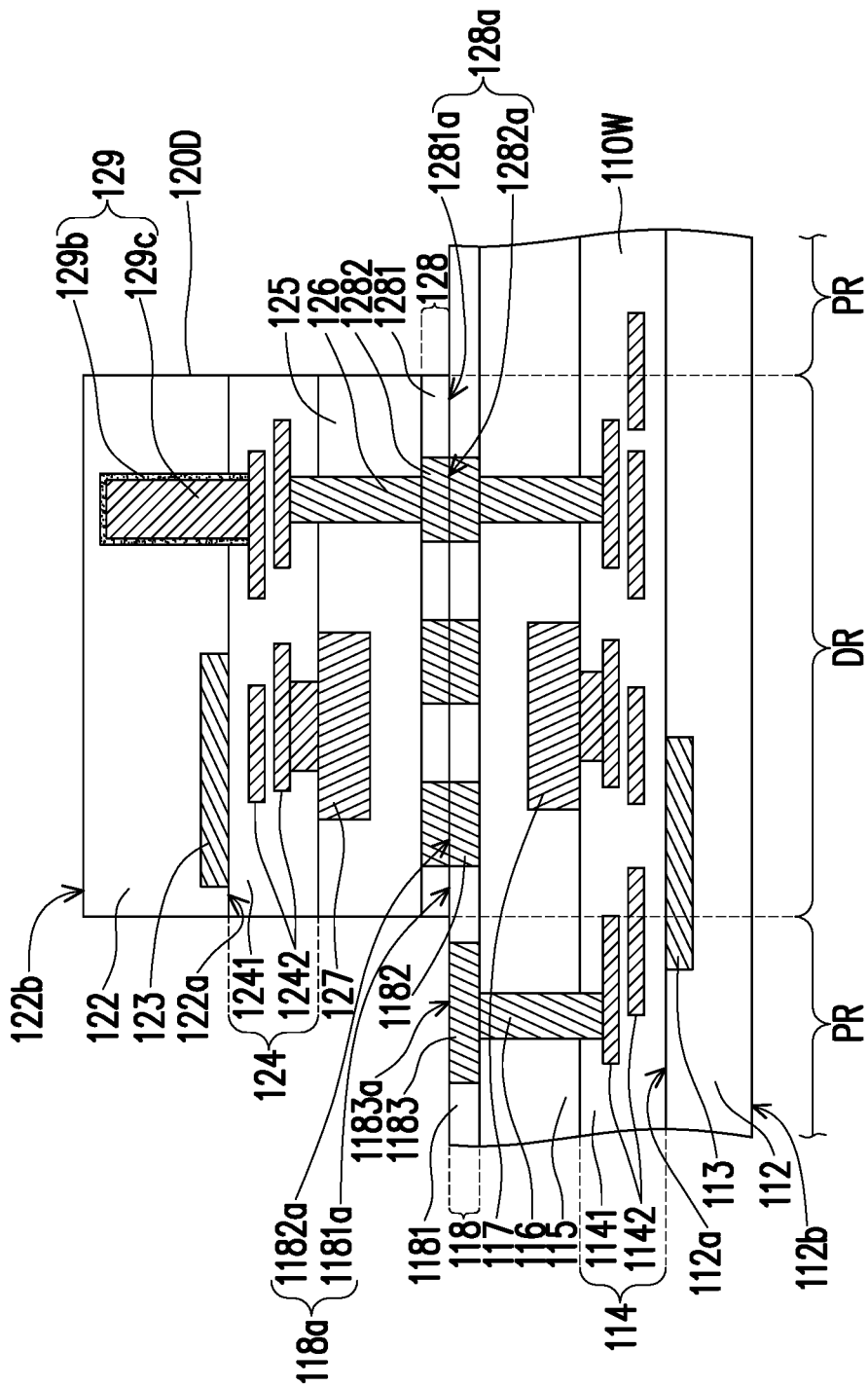
FIGS. 1A-1G are schematic cross-sectional views showing various stages in a manufacturing method of a semiconductor structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are schematic cross-sectional views showing various stages in a manufacturing method of a semiconductor structure according to some embodiments. Referring to FIG. 1A, a semiconductor die 120D is disposed on a semiconductor wafer 110W. The semiconductor wafer 110W may include different die regions that may be singulated in subsequent steps to form a plurality of semiconductor dies (e.g., first semiconductor die 110 shown in FIG. 1G). Although only one die region is shown, it should be appreciated that multiple dies may be formed in the semiconductor wafer 110W, with each die region used to form one first semiconductor die 110.

In some embodiments, the semiconductor wafer 110W includes a first semiconductor substrate 112, which may include a semiconductor material such as silicon, doped or undoped, or an active layer of a semiconductor-on-insulator (SOI) substrate. The first semiconductor substrate 112 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may be used.

The first semiconductor substrate 112 may have an active surface 112a and a rear surface 112b opposite to each other. A plurality of first semiconductor devices 113 may be formed in and/or on the active surface 112a of the first semiconductor substrate 112. For example, the first semiconductor devices 113 includes active devices (e.g., transistors, diodes, etc.) and/or passive devices (e.g., capacitors, resistors, inductors, etc.), or other suitable electrical devices. The semiconductor wafer 110W may include a first interconnect structure 114 formed over the first semiconductor substrate 112 and the first semiconductor devices 113. For example, the first interconnect structure 114 include one or more dielectric layer(s) 1141 and respective metallization pattern(s) 1142 (e.g., metal lines, vias, pads, etc.). The metallization patterns 1142 may be embedded in the dielectric layers 1141 and electrically coupled to the first semiconductor devices 113. The first semiconductor devices 113 and the metallization patterns 1142 may be interconnected to perform one or more functions including memory structures, processing structures, sensors, amplifiers, power distribution, input/output circuitry, or the like. For example, the semiconductor wafer 110W may include logic circuits, processing circuits, control circuits, I/O circuits, memory circuits, bias circuits, testing circuits, reference circuits, and/or the like.

The dielectric layer 1141 of the first interconnect structure 114 may be the inter-metallization dielectric (IMD) layer and may be formed of a dielectric material such as undoped silicate glass (USG), phosphosilicate glass (PSG), borophosphosilicate glass (BPSG), fluorosilicate glass (FSG), $SiO_xC_y$, spin-on-glass, silicon oxide, silicon nitride, silicon carbide, silicon oxynitride, compounds thereof, composites thereof, combinations thereof, and/or the like. The metallization pattern 1142 may route electrical signals between the first semiconductor devices 113 by using vias and/or lines. The material of the metallization patterns 1142 may be or may include tungsten, cobalt, nickel, copper, silver, gold, aluminum, the like, or combinations thereof. In some embodiments, the semiconductor wafer 110W is free of through substrate via (TSV). In alternative embodiments, the semiconductor wafer 110W includes at least one TSV that may penetrate through the first semiconductor substrate 112 and further extend to the first interconnect structure 114.

The semiconductor wafer 110W may include a first inter-dielectric layer 115 formed over the first interconnect structure 114. The material of the first inter-dielectric layer 115 may be made of the material same as or similar to that of the dielectric layer 1141. In some embodiments, the semiconductor wafer 110W includes a plurality of first bonding vias 116 penetrating through the first inter-dielectric layer 115 to be in physical and electrical contact with the metallization patterns 1142 of the first interconnect structure 114. In some embodiments, the semiconductor wafer 110W includes at least one first conductive pad 117 formed over the first interconnect structure 114 and embedded in the first inter-dielectric layer 115. It is appreciated that only one pad 117 is shown in FIG. 1A, but more than one first conductive pad 117 may be present. The material of the first conductive pad 117 may include aluminum, but other suitable conductive material (e.g., copper) may be used. In some embodiments, the first conductive pad 117 is the test pad for electrical testing. The electrical testing may include testing of the functionality of the various semiconductor devices, or testing for open or short circuits that may be expected based on the design. The first conductive pad 117 formed on the metallization patterns 1142 and covered by the first inter-dielectric layer 115 may be electrically floating in the semiconductor wafer 110W.

The semiconductor wafer 110W may include a first bonding structure 118 formed over the first inter-dielectric layer 115 and the first bonding vias 116. For example, the first bonding structure 118 includes a bonding dielectric layer 1181. A material of the bonding dielectric layer 1181 may be or may include silicon oxide (e.g., TEOS formed oxide), silicon nitride, silicon oxynitride, or the like. The materials of the bonding dielectric layer 1181 and the underlying first inter-dielectric layer 115 may be the same or similar. In alternative embodiments, the materials of the bonding dielectric layer 1181 and the underlying first inter-dielectric layer 115 are different. The first bonding structure 118 may include a plurality of first bonding pads 1182 distributed within a die attaching region DR and at least one second bonding pad 1183 located within a peripheral region PR connected to the die attaching region DR. The first bonding pads 1182 and the second bonding pad 1183 may be electrically coupled to the first semiconductor devices 113 through the metallization patterns 1142 of the first interconnect structure 114 and the first bonding vias 116.

For example, at least one of the first bonding pads 1182 is disposed on the bonding via 116 in the die attaching region DR, and may be in physical and electrical contact with the bonding via 116. The second bonding pad 1183 may be disposed on another bonding via 116 in the peripheral region PR, and may be in physical and electrical contact with the bonding via 116. It is appreciated that a single second bonding pad 1183 is shown in FIG. 1A, but more than one second bonding pad(s) 1183 may be present. The first bonding pads 1182 may be formed of a metal that facilitates hybrid bonding, such as copper, a copper alloy, or other suitable conductive material. The second bonding pad 1183 may be made of the material same as or similar to that of the first bonding pads 1182. In some embodiments, the respective bonding pad 1182 and the underlying bonding via 116 are collectively viewed as a bonding connector of the semiconductor wafer 110. The first bonding pads 1182 and the second bonding pad 1183 may be laterally covered by the bonding dielectric layer 1181. In some embodiments, the top surfaces 1182a of the first bonding pads 1182 and the top surface 1183a of the second bonding pad 1183 are substantially leveled with a top surface 1181a of the bonding dielectric layer 1181. In some embodiments, the top surface of the first bonding structure 118 in the die attaching region DR including the top surfaces 1181a and 1182a may be viewed as a bonding surface 118a for the subsequent die bonding process. It is appreciated that the aforementioned examples are provided for illustrative purposes, and other elements may be used as appropriate for a given application.

Continue to FIG. 1A, the semiconductor die 120D may be formed in a semiconductor wafer (not shown), which may include different die regions that are singulated to form a plurality of the semiconductor dies 120D. The semiconductor die 120D may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The semiconductor die 120D may perform the same function as or a different function than the semiconductor wafer 110W.

The semiconductor die 120D may include a second semiconductor substrate 122 having an active surface 122a and a rear surface 122b opposite to each other. For example, the second semiconductor substrate 122 is made of the material same as or similar to the material of the first semiconductor substrate 112. The semiconductor die 120D may include second semiconductor devices 123, such as transistors, capacitors, resistors, diodes, and the like. The second semiconductor devices 123 may be formed in and/or on the active surface 122a of the second semiconductor substrate 122. The semiconductor die 120D may include a second interconnect structure 124 formed over the active surface 122a of the second semiconductor substrate 122. For example, the second interconnect structure 124 includes one or more dielectric layer(s) 1241 and respective metallization patterns 1242 embedded in the dielectric layer 1241. The metallization patterns 1242 may be electrically coupled to the semiconductor devices 123. In some embodiments, the metallization patterns 1242 is viewed as an interconnecting circuitry of the semiconductor die 120D. The materials of the dielectric layer 1241 and the metallization patterns 1242 of the second interconnect structure 124 may be the same as or similar to those of the dielectric layer 1141 and the metallization patterns 1142 of the first interconnect structure 114.

The semiconductor die 120D may include a second inter-dielectric layer 125 formed over the second interconnect structure 124. The second inter-dielectric layer 125 may be made of the material same as or similar to that of the first inter-dielectric layer 115. In some embodiments, the semiconductor die 120D includes at least one second bonding via 126 penetrating through the second inter-dielectric layer 125 to be in physical and electrical contact with the metallization patterns 1242 of the second interconnect structure 124. In some embodiments, the semiconductor die 120D includes at least one second conductive pad 127 formed over the second interconnect structure 124 and embedded in the second inter-dielectric layer 125. Although a single second conductive pad 127 is shown in FIG. 1A, multiple second conductive pads 117 may be present. The second conductive pad 127 may be similar to the first conductive pad 117. In some embodiments, the second conductive pad 127 is the test pad which allows electrical testing. The second conductive pad 127 may be formed on the metallization patterns 1242, but electrically floating in the semiconductor die 120D.

The semiconductor die 120D may include a second bonding structure 128 formed over the second inter-dielectric layer 125 and the second bonding via 126. For example, the second bonding structure 128 includes a bonding dielectric layer 1281 and a plurality of bonding pads 1282 covered by the bonding dielectric layer 1281. In some embodiments, top surfaces 1282a of the bonding pads 1282 are substantially leveled with a top surface 1281a of the bonding dielectric layer 1281. The top surfaces 1282a of the bonding pads 1282 and the top surface 1281a of the bonding dielectric layer 1281 may be viewed as a bonding surface 128a of the second bonding structure 128. In some embodiments, at least one of the bonding pads 1282 is in physical and electrical contact with the second bonding via 126. The second bonding via 126 and the overlying bonding pad 1282 may be collectively viewed as a bonding connector. The bonding connector may be electrically coupled to the second semiconductor devices 123 through the metallization patterns 1242 of the second interconnect structure 124.

The semiconductor die 120D may include at least one TSV 129 formed to connect the metallization patterns 1242 and extend into the second semiconductor substrate 122 from the active surface 122a of the second semiconductor substrate 122. One TSV 129 is shown in FIG. 1A, but more than one TSV 129 may be present. In some embodiments, the TSV 129 includes a conductive material 129c with a barrier layer 129b interposed between the conductive material 129c and the second semiconductor substrate 122. Examples of the conductive material of the TSV 129 include copper, tungsten, aluminum, silver, gold, a combination thereof, and/or the like, and examples of the material of the barrier layer of the TSV 129 include an oxide, a nitride, or an oxynitride, a combination thereof, and/or the like. In some embodiments, the TSV 129 is buried in the second semiconductor substrate 122 and does not extend to the rear surface 122b of the second semiconductor substrate 122 at this stage.

Still referring to FIG. 1A, the semiconductor die 120D and the semiconductor wafer 110W may be separately fabricated, and then the semiconductor die 120D may be positioned at the die attaching region DR of the semiconductor wafer 110W. Next, a bonding process may be performed on the semiconductor die 120D and the semiconductor wafer 110W. For example, the semiconductor die 120D and the semiconductor wafer 110W may be coupled in a face-to-face manner. For example, the active surface 122a of the semiconductor die 120D faces the active surface 112a of the semiconductor wafer 110W, and the second bonding structure 128 of the semiconductor die 120D is boned to the first bonding structure 118 of the semiconductor wafer 110W. The bonding process may include dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like. In some embodiments, the semiconductor die 120D and the semiconductor wafer 110W are bonded through a hybrid bonding process.

For example, to facilitate hybrid bonding, surface preparation for bonding surfaces (e.g., the bonding surface 118a of the semiconductor wafer 110W and the bonding surface 128a of the semiconductor die 120D) is performed to remove particles thereon. The surface preparation may include surface cleaning and activation or other suitable process. In some embodiments, the top surfaces 1182a of the first bonding pads 1182 and the top surfaces 1282a of the bonding pads 1282 may be cleaned by wet cleaning before performing the bonding. For example, not only particles are removed, but also native oxide formed on the top surfaces 1182a of the first bonding pads 1182 and the top surfaces 1282a of the bonding pads 1282 are removed by chemicals used in the wet cleaning. After cleaning, activation of the top surface 1281a of the bonding dielectric layer 1281 and at least a portion of the top surface 1181a of the bonding dielectric layer 1181 corresponding to the die attaching region DR may be performed for development of high bonding strength. For example, plasma activation is performed to treat the top surface 1281a of the bonding dielectric layer 1281 and the top surface 1181a of the bonding dielectric layer 1181.

In some embodiments, the semiconductor die 120D is aligned with the semiconductor wafer 110W and sub-micron alignment precision may be achieved. For example, each bonding pad 1282 of the semiconductor die 120D may be substantially aligned with the corresponding first bonding pad 1182 in the die attaching region DR of the semiconductor wafer 110W. Once the semiconductor die 120D and the semiconductor wafer 110W are aligned precisely, the semiconductor die 120D and the semiconductor wafer 110W may be placed on and in contact with one another. When the activated top surface 1281a of the bonding dielectric layer 1281 is in contact with the activated top surface 1181a of the bonding dielectric layer 1181, the bonding dielectric layer 1281 of the semiconductor die 120D and the bonding dielectric layer 1181 of the semiconductor wafer 110W may be pre-bonded. For example, the semiconductor die 120D and the semiconductor wafer 110W are pre-bonded through the pre-bonding of the bonding dielectric layer 1181 and the bonding dielectric layer 1281. After pre-bonding, the bonding pads 1282 may respectively correspond to and may be in physical contact with the first bonding pads 1182.

In some embodiments, after pre-bonding the semiconductor die 120D and the semiconductor wafer 110W, a hybrid bonding of the semiconductor die 120D and the semiconductor wafer 110W is performed. The hybrid bonding of the semiconductor die 120D and the semiconductor wafer 110W may include a treatment for dielectric bonding to strengthen the bonding between the bonding dielectric layer 1181 and the bonding dielectric layer 1281, and a thermal annealing to facilitate the bonding between the bonding pads 1282 of the semiconductor die 120D and the first bonding pads 1182 of the semiconductor wafer 110W. In some embodiments, the process temperature of the thermal annealing for bonding pads' bonding is higher than that of the treatment for dielectric bonding. Since the thermal annealing performing onto the bonding pads 1282 of the semiconductor die 120D and the first bonding pads 1182 of the semiconductor wafer 110W is performed at relative higher temperature, metal diffusion and grain growth may occur at the bonding interface between the bonding pads 1282 of the semiconductor die 120D and the first bonding pads 1182 of the semiconductor wafer 110W. After the bonding of the semiconductor die 120D and the semiconductor wafer 110W is complete, the bonding pads 1282 and the first bonding pads 1182 provide vertical electrical connections between the semiconductor die 120D and the semiconductor wafer 110W. The second bonding pad 1183 in the peripheral region PR of the semiconductor wafer 110W may remain exposed after the bonding.

Figure 1B:
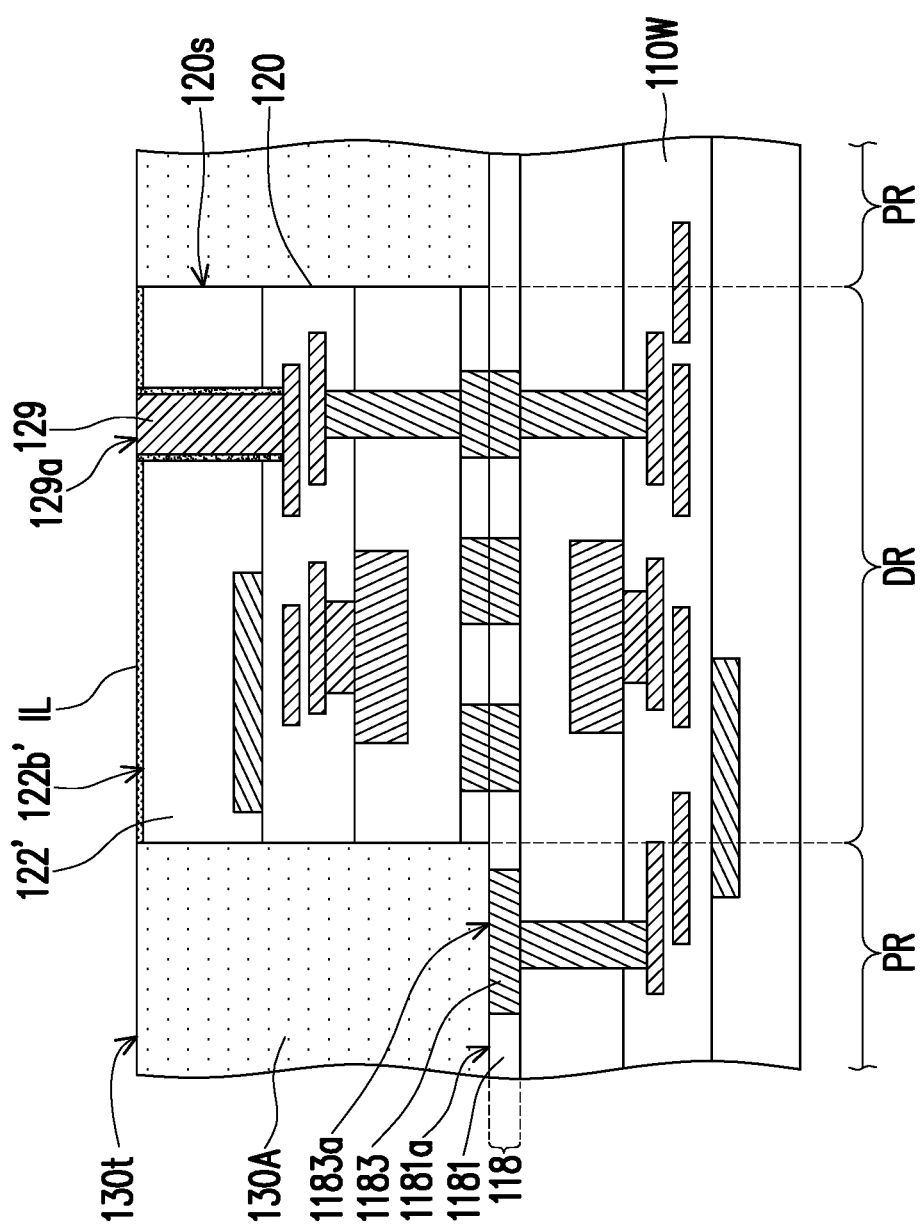

Referring to FIG. 1B and also with reference to FIG. 1A, an insulating material layer 130A is formed on the semiconductor wafer 110W, and then the semiconductor die 120D is thinned to accessibly reveal the TSV 129. For example, an insulating material is formed on the semiconductor wafer 110W corresponding to the peripheral region PR to cover the semiconductor die 120D. The insulating material may be in physical contact with the top surface 1183a of the second bonding pad 1183 and the top surface 1181a of the bonding dielectric layer 1181 in the peripheral region PR. In some embodiments, the insulating material, when initially formed, may cover the rear surface 122b of the second semiconductor substrate 122. The insulating material may be or may include silicon oxide, silicon nitride, tetraethoxysilane (TEOS), and/or the like. In some embodiments, the insulating material is formed through chemical vapor deposition (CVD), plasma-enhanced CVD (PECVD), high-density plasma chemical vapor deposition (HDP-CVD), atomic layer deposition (ALD), or other suitable process.

In some embodiments, a plurality of the semiconductor dies 120D are disposed side by side in an array on the semiconductor wafer 110W, and a gap (not shown) may be formed between neighboring semiconductor dies 120D. The insulating material may be formed in the gap between the neighboring semiconductor dies 120D. In some embodiments, the insulating material is referred to as "gap fill oxide". In some other embodiments, the insulating material includes a molding compound, a molding underfill, a resin (such as epoxy), polymer, or the like. Other suitable insulating material that can provide a degree of protection for the second semiconductor die 120 may be used.

Subsequently, a planarization process (e.g., chemical-mechanical polishing (CMP)) may be performed on the insulating material and the semiconductor die 120D to form the insulating material layer 130A and the second semiconductor die 120, respectively. For example, after the planarization, the insulating material layer 130A extends along the sidewalls 120s of the second semiconductor die 120. The top surface 130t of the insulating material layer 130A may be substantially leveled with the rear surface 122b' of the second semiconductor substrate 122'. After the planarization, the TSV 129 may extend through the second semiconductor substrate 122' and may be accessibly revealed at the rear surface 122b' of the second semiconductor substrate 122'. In some embodiments, the exposed surface 129a of the TSV 129 is substantially leveled with the top surface 130t of the insulating material layer 130A.

In some embodiments, after the planarization process, a portion of the conductive material 129c and a portion of the barrier layer 129b are removed, so that the conductive material 129c laterally covered by the barrier layer 129b is accessibly revealed. The second semiconductor substrate 122' may be then slightly etched, so that a portion of the TSV 129 may be protruded from the rear surface 122b'. Subsequently, an isolating liner IL is formed on the rear surface 122b' of the second semiconductor substrate 122' to laterally cover the portion of the TSV 129 that is protruded from the rear surface 122b'. In some embodiments, the top surface 130t of the insulating material layer 130A may be substantially leveled with the top surface of the isolating liner IL. The isolating liner IL may separate the second semiconductor substrate 122' from the subsequently formed metal layer (e.g., the second die connector 154). The material of the isolating liner IL may be or may include silicon nitride, an oxide, silicon oxynitride, silicon carbide, a polymer, the like, etc.

Figure 1C:
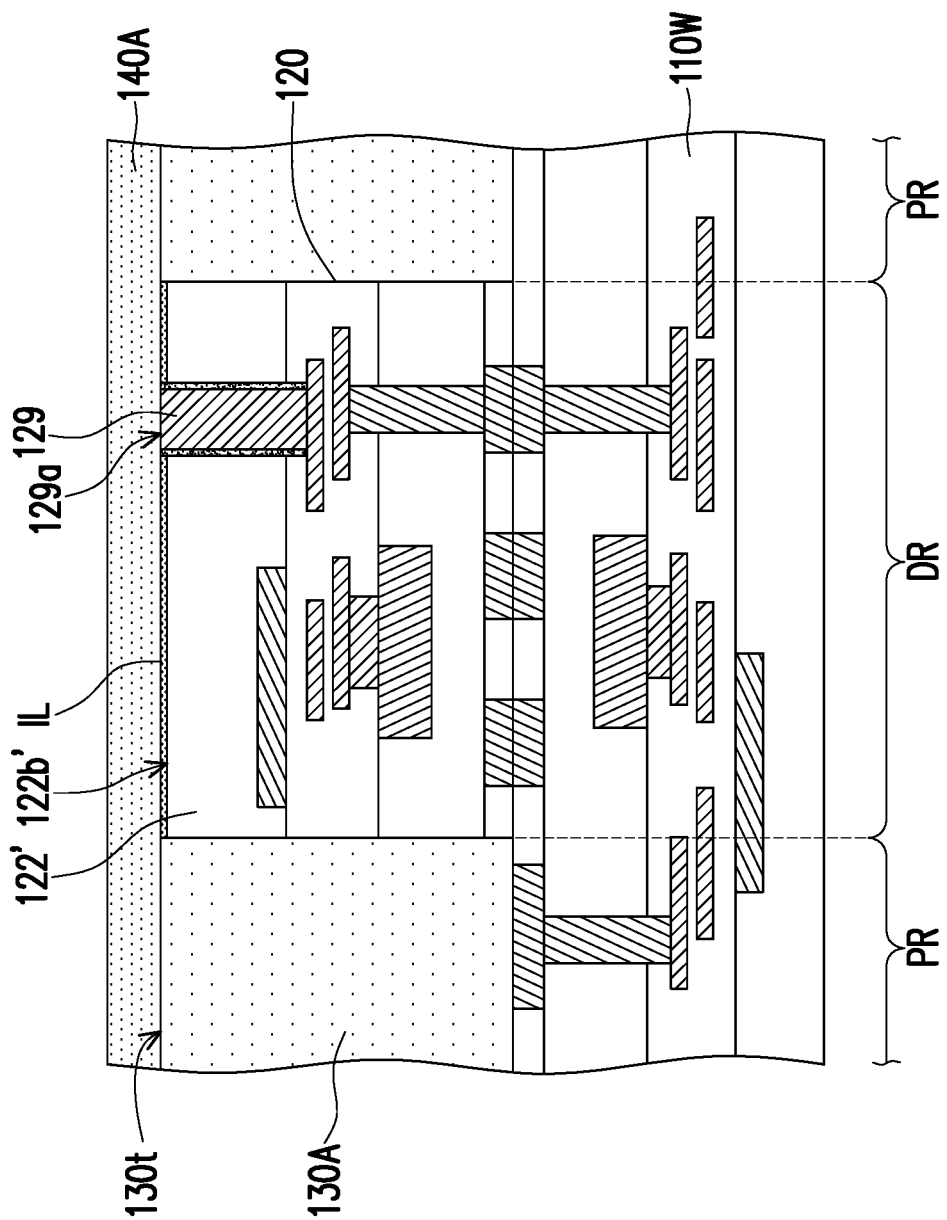

Referring to FIG. 1C, a dielectric material layer 140A is formed on the insulating material layer 130A and the second semiconductor die 120. For example, the dielectric material layer 140A is in physical contact with the isolating liner IL, the exposed surface 129a of the TSV 129, and the top surface 130t of the insulating material layer 130A. The isolating liner IL may be interposed between the second semiconductor substrate 122' and the overlying dielectric material layer 140A. The dielectric material layer 140A may be formed of undoped silicate glass (USG), phosphosilicate glass (PSG), borophosphosilicate glass (BPSG), fluorosilicate glass (FSG), TEOS, compounds thereof, composites thereof, combinations thereof, or the like. In some embodiments, the dielectric material layer 140A and the underlying insulating material layer 130A are formed of different materials. For example, the dielectric material layer 140A has an etch selectivity different than that of the underlying insulating material layer 130A. The dielectric material layer 140A may be formed by any suitable method such as spin-coating, CVD, PECVD, HDP-CVD, ALD, or the like.

Figure 1D:
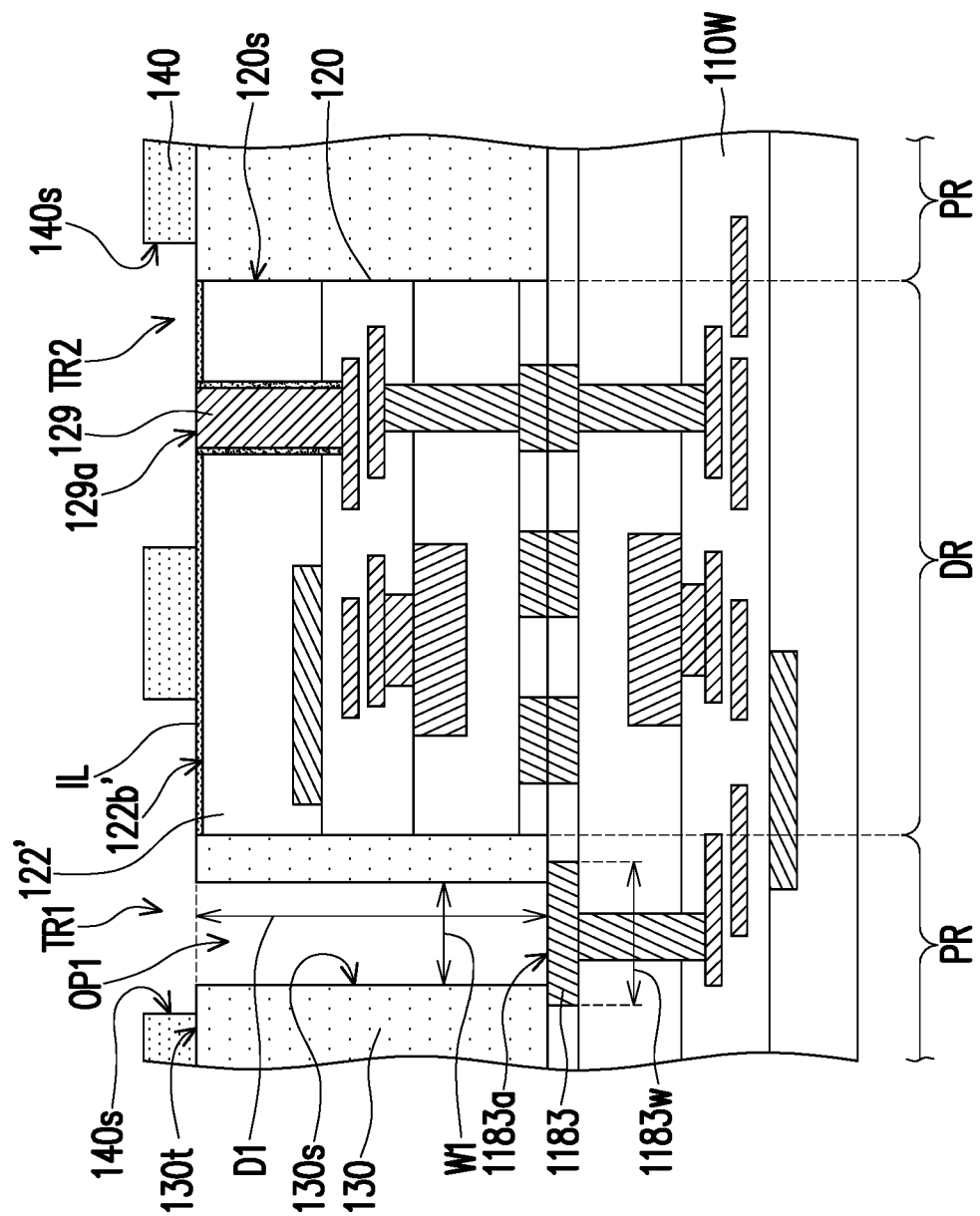

Referring to FIG. 1D, a portion of the dielectric material layer 140A and a portion of the insulating material layer 130A may be removed to form the dielectric layer 140 and the insulating layer 130, respectively. For example, the dielectric layer 140 includes a first trench TR1 and a second trench TR2. The first trench TR1 may accessibly expose at least a portion of the top surface 130t of the underlying insulating layer 130 corresponding to the peripheral region PR of the semiconductor wafer 110W. In some embodiments, the first trench TR1 laterally extends to expose at least a portion of the second semiconductor substrate 122' corresponding to the die attaching region DR of the semiconductor wafer 110W. In some embodiments in which the isolating liner IL is formed on the rear surface 122b' of the second semiconductor substrate 122', the first trench TR1 accessibly exposes the top surface 130t of the insulating layer 130 and extends to reveal the top surface of the isolating liner IL. In some other embodiments, the first trench TR1 exposes at least a portion of another TSV (not shown) of the second semiconductor die 120. In other embodiments, the first trench TR1 does not extend to expose the second semiconductor die 120.

The second trench TR2 of the dielectric layer 140 may accessibly reveal at least a portion of the exposed surface 129a of the TSV 129. In some embodiments, the second trench TR2 is wide enough to expose the exposed surface 129a of the TSV 129 and a portion of the isolating liner IL surrounding the TSV 129. In some embodiments, the second trench TR2 further extends to expose at least a portion of the top surface 130t of the insulating layer 130 corresponding to the peripheral region PR. It is noted that the widths of the first trench TR1 and the second trench TR2 of the dielectric layer 140 may depend on the design requirements and construe no limitation in the disclosure. It is also appreciated that one first trench TR1 and one second trench TR2 are shown in FIG. 1D, but more than one first trench TR1 and/or more than one second trench TR2 may be present.

Continue to FIG. 1D, the insulating layer 130 may have at least one first via opening OP1 in communication with the first trench TR1 of the dielectric layer 140. For example, the first via opening OP1 accessibly exposes at least a portion of the top surface 1183a of the second bonding pad 1183 of the semiconductor wafer 110W for further electrical connection. One via opening is shown in FIG. 1D, but more than one first via opening OP1 may be present. In some embodiments, the width (or diameter) W1 of the first via opening OP1 is smaller than the width (or diameter) of the corresponding first trench TR1. In some embodiments, the width W1 of the first via opening OP1 ranges from about 2 µm to about 5 µm. For example, the width W1 of the first via opening OP1 is less than the width (or diameter) 1183w of the second bonding pad 1183. The width 1183w of the second bonding pad 1183 may be substantially equal to or less than that of the first trench TR1. Alternatively, the width 1183w of the second bonding pad 1183 is greater than that of the first trench TR1. In some embodiments, the width 1183w of the second bonding pad 1183 ranges from about 2 µm to about 5 µm. In some embodiments, a difference is between the width 1183w of the second bonding pad 1183 and the width W1 of the first via opening OP1. The difference of the widths (1183w and W1) is, for example, about 0.5 µm. Alternatively, the difference of the widths (1183w and W1) may be greater than or less than 0.5 µm. In some embodiments, an aspect ratio of the depth D1 over the width W1 is less than or substantially equal to 15. For example, the aspect ratio (D1/W1) ranges from about 1 to about 15.

Still referring to FIG. 1D, the removal of the portion of the dielectric material layer 140A and the portion of the insulating material layer 130A may be performed by lithography and etching or other suitable methods. For example, the first trench TR1 and the second trench TR2 of the dielectric layer 140 are formed by photoresist patterning and by etching the patterns into the dielectric material layer 140A. In some embodiments, the insulating material layer 130A serves as an etch stop layer when patterning the dielectric material layer 140A. Subsequently, the first via opening OP1 of the insulating layer 130 is formed by via resist patterning and etching through the insulating material layer 130A. In some embodiments, the etching is performed using the second bonding pad 1183 as the etch stop layer. The first trench TR1, the second trench TR2, and the first via opening OP1 may be formed during the same step. It is appreciated that etch stop layer(s) (not shown) may be disposed between the dielectric material layer 140A and the insulating material layer 130A and/or between the insulating material layer 130A and the semiconductor wafer 110W. The etch stop layer may have a high etching selectivity relative to the overlying layer (e.g., the dielectric material layer 140A and/or the insulating material layer 130A). In some embodiments, the etch stop layer is formed of silicon nitride, silicon carbon nitride, silicon carbo-oxide, combinations thereof, or the like.

In some embodiments, the etching process includes an anisotropic dry etch. The type of etchant applied for etching the first trench TR1, the second trench TR2, and the first via opening OP1 may be determined by the processing and functional application. A wet clean process is optionally performed after the etching process. In some embodiments, inner sidewalls 130s of the insulating layer 130 that define the first via opening OP1 are substantially vertical. For example, the inner sidewalls 130s of the insulating layer 130 are substantially perpendicular to the top surface 1183a of the second bonding pad 1183. In some embodiments, the dielectric layer 140 may have inner sidewalls 140s that define the first trench TR1 and the second trench TR2. For example, the inner sidewalls 140s are substantially vertical and may be substantially perpendicular to the rear surface 122b' of the second semiconductor substrate 122' and/or the top surface 130t of the underlying insulating layer 130.

Figure 1E:
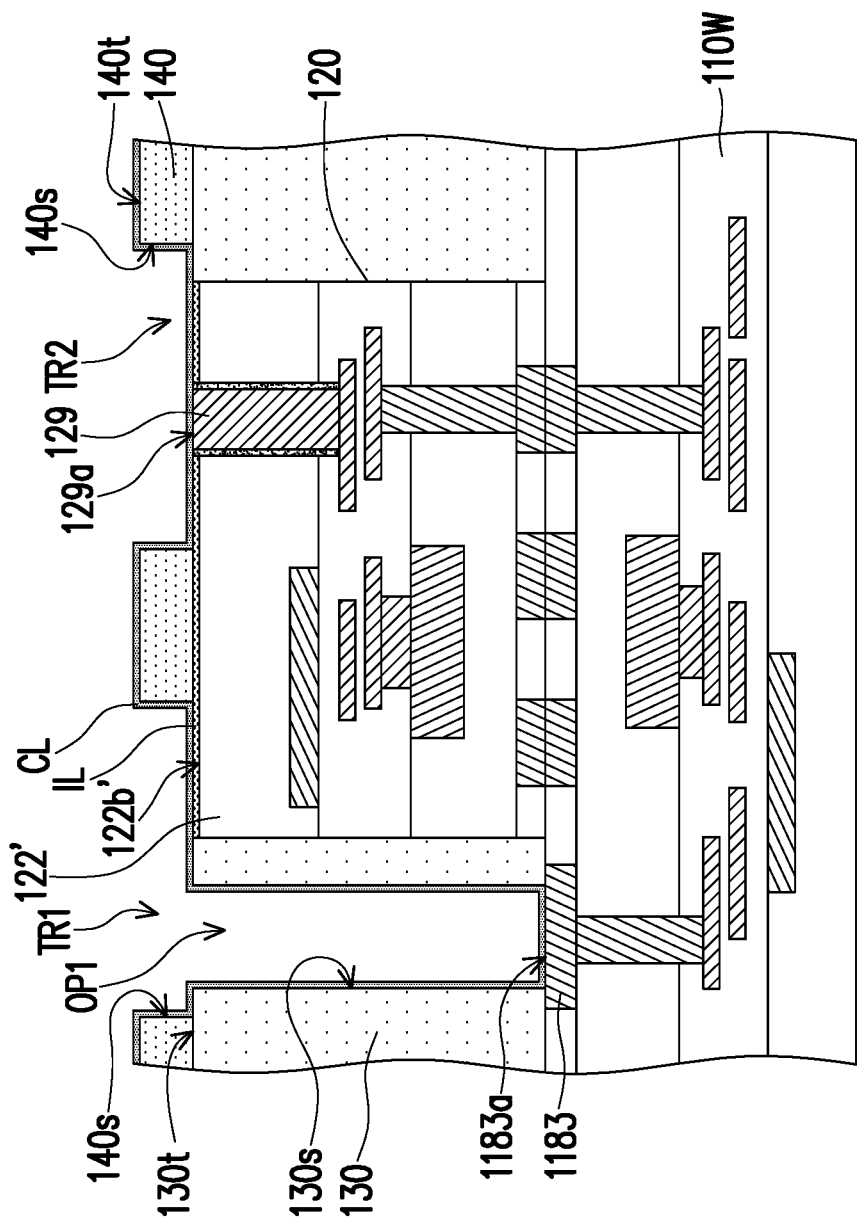
Figure 1F:
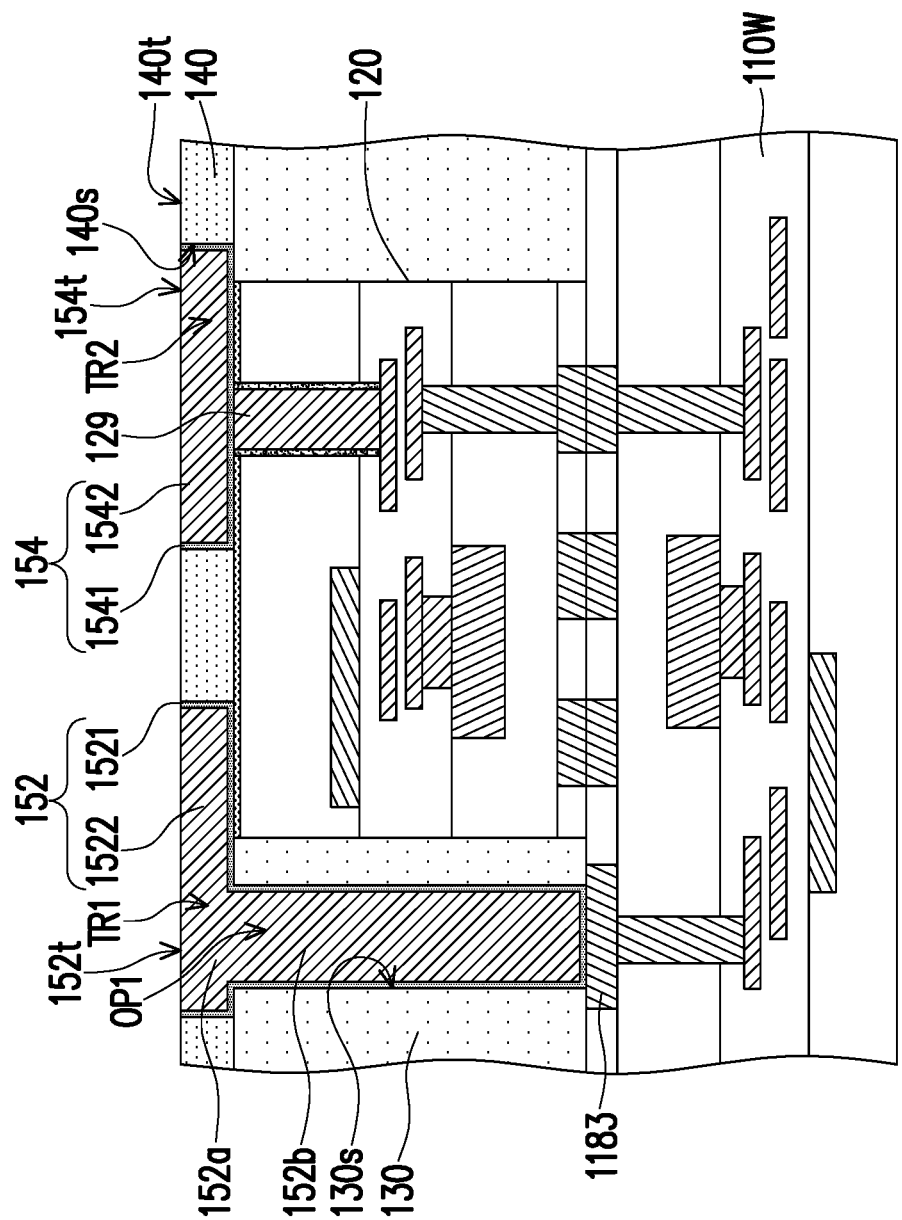

Referring to FIGS. 1E-1F, a first die connector 152 is formed in the first trench TR1 and the first via opening OP1 in communication with the first trench TR1, and a second die connector 154 is formed in the second trench TR2. For example, a conductive liner CL is initially formed on the resulting structure as shown in FIG. 1E. For example, the conductive liner CL covers the top surface 140t of the dielectric layer 140 and also conformally covers the surfaces that define the first trench TR1, the second trench TR2, and the first via opening OP1. In some embodiments, a portion of the conductive liner CL is in direct contact with the surfaces that define the first trench TR1 and the first via opening OP1 (e.g., the top surface 1183a of the second bonding pad 1183, the inner sidewalls 130s of the insulating layer 130, and the inner sidewalls 140s of the dielectric layer 140). In some embodiments, another portion of the conductive liner CL may conformally cover surfaces that define the second trench TR2 (e.g., the inner sidewalls 140s of the dielectric layer 140, the exposed surface 129a of the TSV 129). The portion of the conductive liner CL may be in physical and electrical contact with the second bonding pad 1183, and the another portion of the conductive liner CL is in physical and electrical contact with the TSV 129. Depending on the size of the second trench TR2, the another portion of the conductive liner CL may also be formed on the rear surface 122b' of the second semiconductor substrate 122' and further extend to be in physical contact with the top surface 130t of the insulating layer 130. In some embodiments in which the isolating liner IL is formed on the rear surface 122b' of the second semiconductor substrate 122', the conductive liner CL is in physical contact with the portions of the isolating liner IL that are exposed by the first trench TR1 and the second trench TR2.

Continue to FIG. 1E, a deposition process (e.g., CVD, PVD, ALD, sputtering, combinations thereof, and/or the like) may be performed to form the conductive liner CL. In some embodiments, the conductive liner CL includes a barrier layer (not individually illustrated) formed of titanium, titanium nitride, titanium oxynitride, tantalum, tantalum nitride, tantalum oxynitride, tungsten, tungsten nitride, a combination thereof, and/or the like. In some embodiments, the barrier layer is conformally formed in the first trench TR1, the second trench TR2, and the first via opening OP1, so that the barrier layer is in direct contact with the second bonding pad 1183, the TSV 129, the insulating layer 130, and the dielectric layer 140. In some embodiments, the conductive liner CL includes a seed layer (not individually illustrated) that aids in the formation of a thicker conductive layer during subsequent processing steps. For example, the seed layer is a single metal layer or a composite metal layer including sub-layers formed of different materials. In some embodiments, the seed layer includes a titanium layer and a copper layer formed over the titanium layer. In some embodiments, the conductive liner CL includes the seed layer conformally formed over the barrier layer, so that the barrier layer is interposed between the seed layer and the second bonding pad 1183, and between the seed layer and the TSV 129. Alternatively, the barrier layer is omitted.

Subsequently, a conductive material may be formed on the conductive liner CL and fill the first trench TR1, the second trench TR2, and the first via opening OP1. The conductive material may be formed by a plating process, CVD, ALD, PVD, combinations thereof, or the like. Examples of the conductive material include copper, tungsten, aluminum, silver, gold, combinations thereof, or the like. In some embodiments, excess conductive material and the underlying conductive liner CL may be removed from the top surface 140*t* of the dielectric layer 140 to form the first die connector 152 and the second die connector 154. For example, a planarization process (e.g., CMP or the like) is performed to level the surface of the conductive liner CL and the conductive material, and to remove excess materials from the top surface 140*t* of the dielectric layer 140. In some embodiments, after the planarization process, the top surface 152*t* of the first die connector 152 and the top surface 154*t* of the second die connector 154 are substantially leveled with the top surface 140*t* of the dielectric layer 140.

Continue to FIG. 1F, the first die connector 152 including the conductive material layer 1522 and the underlying conductive liner layer 1521 may be electrically connected to the second bonding pad 1183. The conductive liner layer 1521 may be physically interposed between and electrically connected to the conductive material layer 1522 and the second bonding pad 1183. The conductive liner layer 1521 may extend along the inner sidewalls (130*s* and 140*s*) of the insulating layer 130 and the dielectric layer 140 to spatially separate the conductive material layer 1522 from the insulating layer 130 and the dielectric layer 140. For example, in a top view, the conductive material layer 1522 is encircled by the conductive liner layer 1521, and the dielectric layer 140 surrounds the conductive liner layer 1521. In some embodiments in which the isolating liner IL is formed on the rear surface 122*b*′ of the second semiconductor substrate 122′, the conductive liner layer 1521 is physically interposed between the conductive material layer 1522 and the isolating liner IL formed on the second semiconductor substrate 122′.

The second die connector 154 including the conductive material layer 1542 and the underlying conductive liner layer 1541 may be electrically connected to the TSV 129. The conductive liner layer 1541 may be physically interposed between and electrically connected to the TSV 129 and the conductive material layer 1542. The conductive liner layer 1541 may extend along the inner sidewalls 140*s* of the dielectric layer 140 and the rear surface 122*b*′ of the semiconductor substrate 122′ to spatially separate the conductive material layer 1542 from the dielectric layer 140. For example, in the top view, the conductive material layer 1542 is encircled by the conductive liner layer 1541, and the dielectric layer 140 surrounds the conductive liner layer 1541. In some embodiments in which the isolating liner IL is formed on the rear surface 122*b*′ of the second semiconductor substrate 122′, the conductive liner layer 1541 is physically interposed between the conductive material layer 1542 and the isolating liner IL formed on the second semiconductor substrate 122′. In some other embodiments, the first die connector 152 may be in contact with another TSV (not shown) so that the semiconductor wafer 110W may be electrically coupled to the second semiconductor die 120 through the another TSV and the first die connector 152.

Still referring to FIG. 1F, the first die connector 152 may include a first portion 152*a* and a second portion 152*b* connecting the first portion 152*a* to the second bonding pad 1183. For example, the first portion 152*a* of the first die connector 152 is laterally covered by the dielectric layer 140, and the second portion 152*b* of the first die connector 152 is laterally covered by the insulating layer 130. A portion of the insulating layer 130 is interposed between the second portion 152*b* of the first die connector 152 and the second semiconductor die 120. In some embodiments, the first portion 152*a* of the first die connector 152 and the second die connector 154 spatially separated by the dielectric layer 140 may be viewed as a conductive pattern. The second portion 152*b* of the first die connector 152 penetrating through the insulating layer 130 may be referred to as a through dielectric via (TDV). Since the first portion 152*a* and the second portion 152*b* are integratedly formed, no interface (e.g., a barrier layer, a seed layer, or the like) is between the first portion 152*a* and the second portion 152*b*. By such configuration, electrical resistance may be reduced and electrical performance may be improved.

Figure 1G:
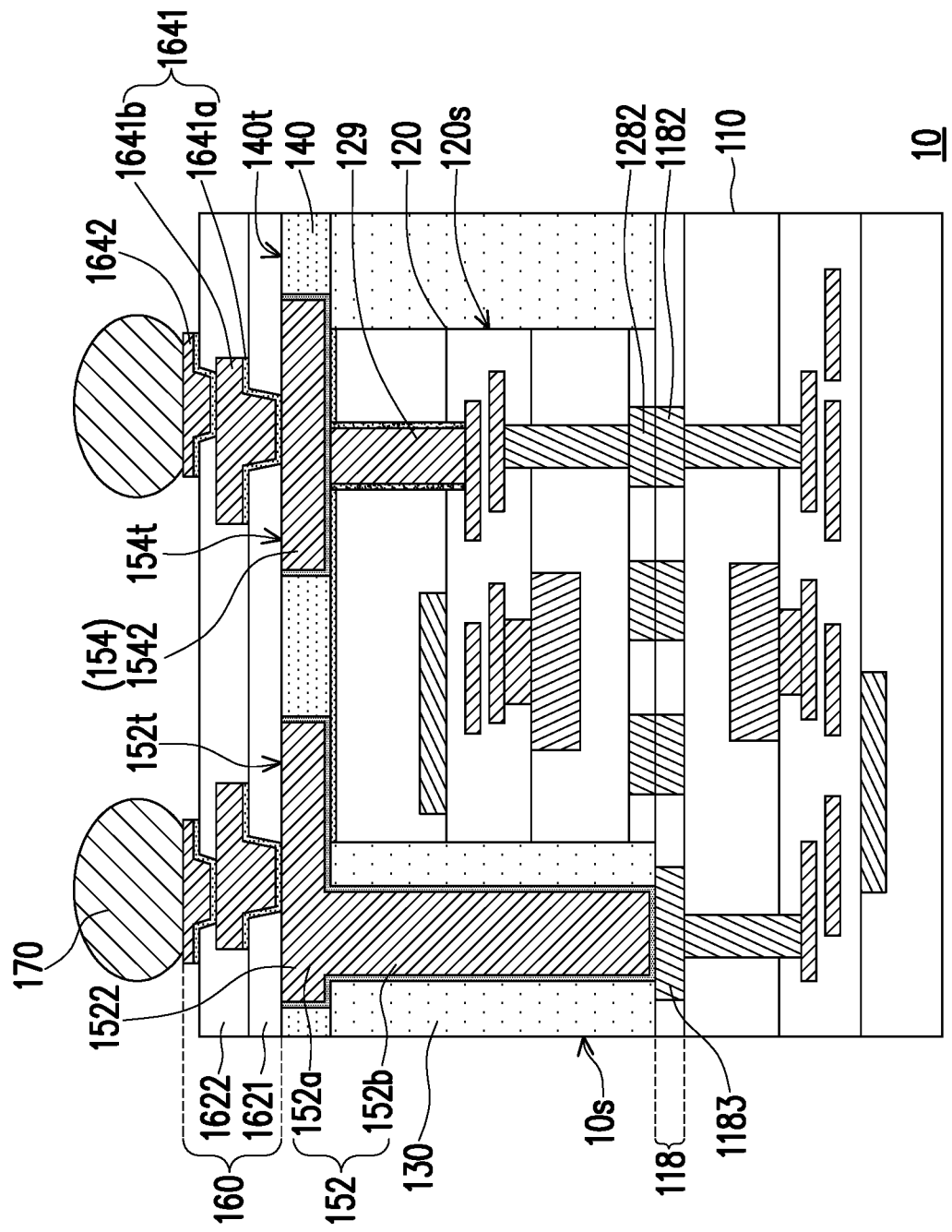

Referring to FIG. 1G, a redistribution structure 160 may be formed on the dielectric layer 140, the first die connector 152, and the second die connector 154. Subsequently, a plurality of conductive terminals 170 may be formed on the redistribution structure 160. For example, the redistribution structure 160 includes at least one patterned dielectric layer (e.g., 1621 and 1622) and at least one patterned conductive layer (e.g., 1641 and 1642). The patterned conductive layer may be referred to as the redistribution layer or the redistribution lines. Two patterned dielectric layers and two patterned conductive layers are shown in FIG. 1G, but more or fewer patterned dielectric layers and patterned conductive layers may be present.

In some embodiments, the forming process of the redistribution structure 160 includes at least the following steps. For example, a dielectric material is formed on the top surface 152*t* of the first die connector 152, the top surface 154*t* of the second die connector 154, and the top surface 140*t* of the dielectric layer 140 by spin-coating, lamination, CVD, a combination thereof, and/or the like. The dielectric material may be or may include silicon oxide, silicon nitride, low-k dielectrics, combinations of these, and/or the like. In some other embodiments, the dielectric material includes polybenzoxazole (PBO), polyimide (PI), benzocyclobutene (BCB), or the like. The dielectric material is then patterned to form the patterned dielectric layer 1621. For example, the patterning (e.g., lithography and etching, or the like) forms openings exposing portions of the first die connector 152 and the second die connector 154. Next, the patterned conductive layer 1641 is formed on the patterned dielectric layer 1621 and into the openings of the patterned dielectric layer 1621. For example, the patterned conductive layer 1641 includes conductive lines, conductive pads, and conductive vias. The conductive vias of the patterned conductive layer 1641 may extend through the patterned dielectric layer 1621 to physically and electrically couple the underlying first die connector 152 and the underlying second die connector 154 to subsequently formed structures. In some embodiments, the conductive vias of the patterned conductive layer 1641 are tapered towards the underlying structure (e.g., the first die connector 152 and the second die connector 154). Alternatively, the conductive vias of the patterned conductive layer 1641 may include vertical sidewalls.

In some embodiments, the patterned conductive layer 1641 is formed by depositing a seed material layer, forming and patterning a photoresist layer on the seed material layer to expose portions of the seed material layer, forming a conductive material layer in the openings of the photoresist layer and on the exposed portions of the seed material layer, removing the photoresist layer, and removing portions of the seed material layer on which the conductive material layer is not formed. In some embodiments, an etching process may be performed to remove excess portions of the seed material layer which are not covered by the conductive material layer. The sidewalls of the conductive material layer 1641b and the underlying seed material pattern 1641a may be substantially leveled.

The combination of the conductive material layer 1641b and the underlying seed material pattern 1641a form the patterned conductive layer 1641. For example, the seed material pattern 1641a may be a titanium/copper bilayer, a copper layer, or other suitable metal layer. The conductive material layer 1641b may include a metal, like copper, titanium, tungsten, aluminum, or the like. The seed material pattern 1641a may be interposed between the conductive material layer 1641b and the first die connector 152, and between the conductive material layer 1641b and the second die connector 154. In some embodiments, the seed material pattern 1641a is in physical and electrical contact with the top surface 152t of the first die connector 152 and the top surface 154t of the second die connector 154, respectively. In some embodiments in which the seed material pattern 1641a includes titanium/copper bilayer, the titanium sublayer of the seed material pattern 1641a is in direct contact with the conductive material layer 1522 of the first die connector 152 and the conductive material layer 1542 of the second die connector 154.

Continue to FIG. 1G, the patterned dielectric layer 1622 is then formed on the patterned dielectric layer 1621 to cover the patterned conductive layer 1641. For example, the openings of the patterned dielectric layer 1622 accessibly reveal at least a portion of the patterned conductive layer 1641 for further electrical connection. Next, the patterned conductive layer 1642 is formed on the patterned dielectric layer 1622 and physically and electrically connected to the patterned conductive layer 1641. The materials and the forming processes of the patterned dielectric layer 1622 and the patterned conductive layer 1642 may be similar to the patterned dielectric layer 1621 and the patterned conductive layer 1641, so the detailed descriptions are not repeated for the sake of brevity. In some embodiments in which fewer patterned dielectric layer and patterned conductive layer are to be formed, the forming processes discussed above may be omitted. In some embodiments in which more patterned dielectric layers and patterned conductive layers are to be formed, the forming processes discussed above may be repeated.

In some embodiments, the patterned conductive layer 1642 may include under bump metallization (UBM) pads for providing electrical connections to the underlying structure upon which the conductive terminals 170 may be formed. In some embodiments, the patterned conductive layer 1642 includes aluminum pads, and the conductive terminals 170 land thereon the aluminum pads. Other suitable conductive materials (e.g., copper) may be used to for the landing pads of the patterned conductive layer 1642. For example, the conductive terminals 170 may be or may include microbumps, controlled collapse chip connection (C4) bumps, metal pillars, solder balls, ball grid array (BGA) connectors, electroless nickel-electroless palladium-immersion gold (ENEPIG) formed bumps, or the like. The conductive terminals 170 may include a conductive material such as solder, copper, aluminum, gold, nickel, silver, palladium, tin, the like, or a combination thereof. The conductive terminals 170 may include bump shapes or may have substantially vertical sidewalls. It is noted that the shape of the conductive terminal 170 shown in FIG. 1G is provided for illustrative purposes, the conductive terminals 170 may have various cross section depending on the design requirements.

Still referring to FIG. 1G, a singulation process (e.g., a sawing process or other dicing process) may be performed to separate the resulting structure into a plurality of individual semiconductor structures 10. For example, a dicing tool (not shown) cuts through the redistribution structure 160, the underlying dielectric layer 140, the underlying insulating layer, and the underlying semiconductor wafer 110W to form the semiconductor structure 10. The semiconductor wafer 110W is cut to form the first semiconductor die 110 after the singulation. In some embodiments, the redistribution structure 160, the underlying dielectric layer 140, the underlying insulating layer 130, and the first semiconductor die 110 may have substantially coterminous sidewalls 10s after the singulation. The semiconductor structure 10 may be system-on-chip (SoC) or system-on-integrated-circuit (SoIC) devices. In such embodiments, the processing, memory, and/or electronic control functionality may be integrated on the semiconductor structure 10.

The semiconductor structure 10 may include the first semiconductor die 110, the second semiconductor die 120 attached to the first semiconductor die 110, the insulating layer 130 disposed on the first semiconductor die 110 and extending along the sidewalls 120s of the second semiconductor die 120, the dielectric layer 140 disposed on the insulating layer 130 and the second semiconductor die 120, the first die connector 152 having the first portion 152a laterally covered by the dielectric layer 140 and the second portion 152b laterally covered by the insulating layer 130, the second die connector 154 laterally covered by the dielectric layer 140 and directly connected to the TSV 129, the redistribution structure 160 disposed on the dielectric layer 140, the first die connector 152, and the second die connector 154, and the conductive terminals 170 disposed on the redistribution structure 160.

The first bonding pads 1182 of the first semiconductor die 110 may be physically and electrically connected to the bonding pads 1282 of the second semiconductor die 120. In some other embodiments, the first semiconductor die 110 is electrically coupled to the second semiconductor die 120 through the first die connector 152 connected to another TSV (not shown) of the second semiconductor die 120. In some embodiments, the first semiconductor die 110 is electrically coupled to the redistribution structure 160 through the first die connector 152. The first die connector 152 may be viewed as a dual damascene connector. The second semiconductor die 120 may be electrically coupled to the redistribution structure 160 through the second die connector 154. The second die connector 154 may be viewed as a single damascene connector. In some embodiments, the first semiconductor die 110 is electrically coupled to the redistribution structure 160 through the second semiconductor die 120 and the second die connector 154. The conductive terminals 170 may be electrically coupled to the first semiconductor die 110 and the second semiconductor die 120 through the redistribution structure 160.

The first portion 152a of the first die connector 152 may be physically and electrically connected to redistribution structure 160, and the second portion 152b of the first die connector 152 may be physically and electrically connected to the second bonding pad 1183 of the first semiconductor die 110. The first portion 152a and the second portion 152b of the first die connector 152 may be formed in the same formation process, so that the first portion 152a may form a continuous region with the underlying second portion 152b.

There is no visible interface between first portion 152a and the second portion 152b. In this manner, the process steps and the processing cost of the semiconductor structure 10 may be reduced. The electrical interfaces between the first semiconductor die 110 and the redistribution structure 160 may be reduced by forming the first die connector 152, and thus electrical performance and interconnect reliability of the semiconductor structure 10 may be improved.

FIGS. 2A-2E are schematic cross-sectional views showing various stages in a manufacturing method of a semiconductor structure according to some embodiments. Throughout the various views and illustrative embodiments of the disclosure, like reference numbers are used to designate like elements. Unless specified otherwise, the materials and the formation methods of the elements described herein are essentially the same as the like elements described in FIGS. 1A-1G.

Figure 2A:
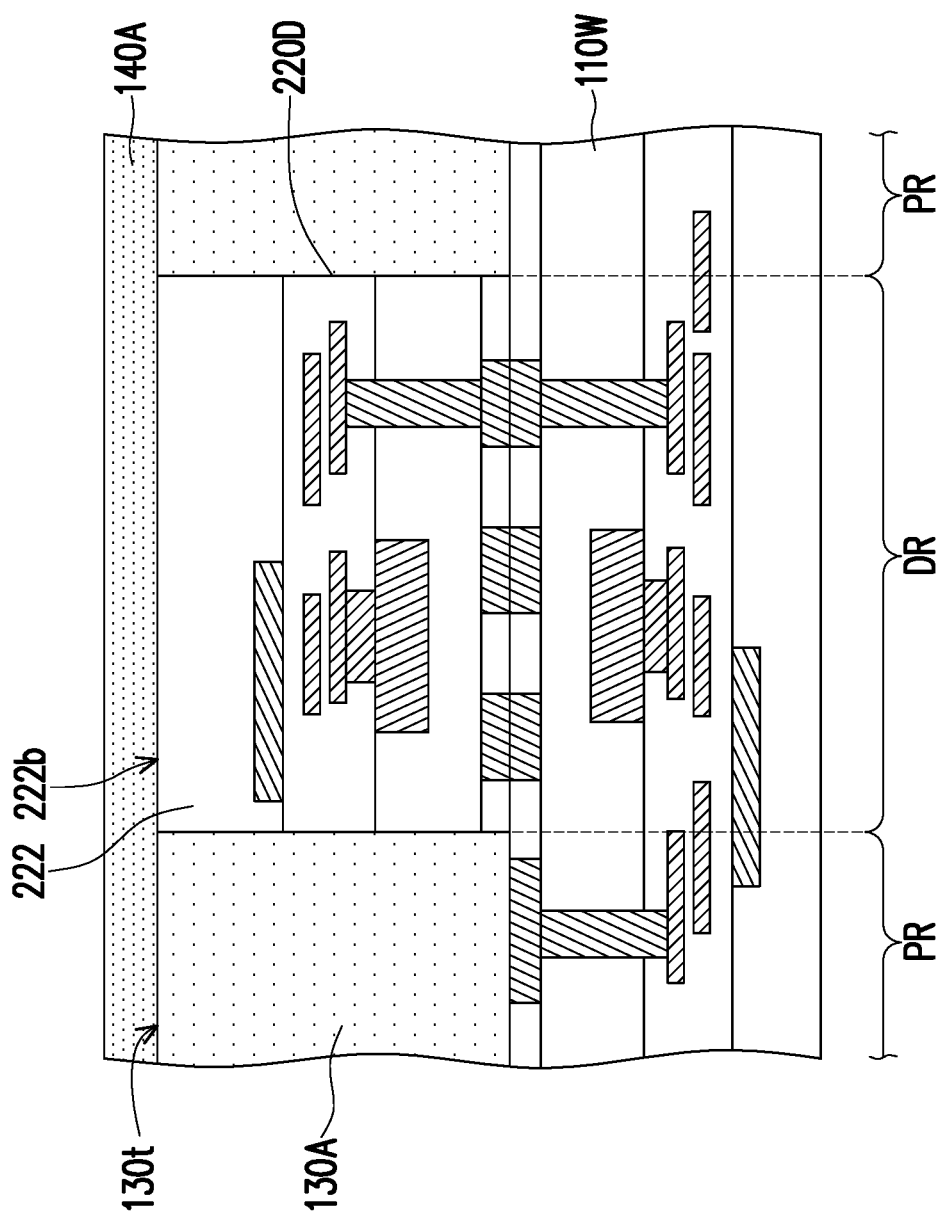
FIGS. 2A-2E are schematic cross-sectional views showing various stages in a manufacturing method of a semiconductor structure according to some embodiments.

Referring to FIG. 2A, a semiconductor die 220D is bonded to the semiconductor wafer 110W in the die attaching region DR. The semiconductor die 220D is similar to the semiconductor die 110D described in FIG. 1A, except that no TSV is formed in the semiconductor die 220D at this stage. The bonding process is similar to the process described in FIG. 1A, so the detailed descriptions are not repeated for the sake of brevity. After bonding the semiconductor die 220D to the semiconductor wafer 110W, the insulating material layer 130A may be formed on the semiconductor wafer 110W to laterally cover the semiconductor die 220D. A planarization process is optionally performed on the insulating material layer 130A and the semiconductor die 220D to level the top surface 130t of the insulating material layer 130A and the rear surface 222b of the semiconductor substrate 222 of the semiconductor die 220D. Subsequently, the dielectric material layer 140A may be formed on the top surface 130t of the insulating material layer 130A and the rear surface 222b of the semiconductor substrate 222. The forming processes and the materials of the insulating material layer 130A and the dielectric material layer 140A may be similar to those of the insulating material layer 130A and the dielectric material layer 140A described in FIGS. 1B-1C, so the detailed descriptions are omitted for simplicity.

In some other embodiments, the isolating liner is formed on the rear surface 222b of the semiconductor substrate 222 prior to forming the dielectric material layer 140A. For example, after planarizing the insulating material layer 130A and the semiconductor die 220D, the semiconductor substrate 222 may be slightly etched to form a recess, and then the isolating liner is formed in the recess of the semiconductor substrate 222. The isolating liner formed on the semiconductor substrate 222 may be substantially leveled with the top surface 130t of the insulating material layer 130A. Subsequently, the dielectric material layer 140A is formed on the top surface 130t of the insulating material layer 130A and the isolating liner. In this manner, the isolating liner is interposed between the semiconductor substrate 222 and the dielectric material layer 140A.

Figure 2B:
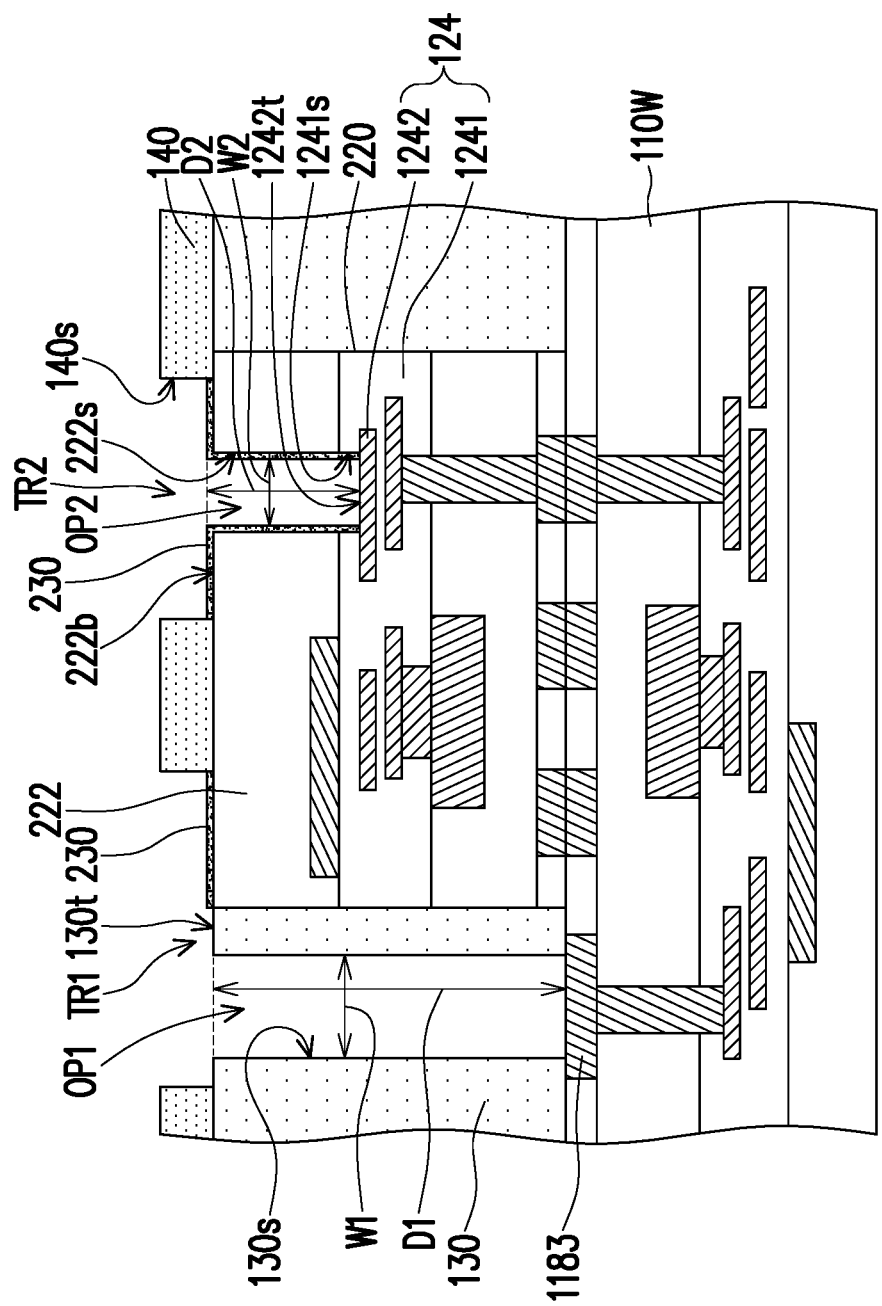

Referring to FIG. 2B, a portion of the dielectric material layer 140A and a portion of the insulating material layer 130A are removed to form the dielectric layer 140 and the insulating layer 130, respectively. The dielectric layer 140 may include the first trench TR1 and the second trench TR2, and the insulating layer 130 may include the first via opening OP1 in communication with the first trench TR1 of the dielectric layer 140 and exposing the second bonding pad 1183 of the semiconductor wafer 110W. In some embodiments, a portion of the semiconductor die 220D is removed to form the second semiconductor die 220 having a second via opening OP2. For example, the second via opening OP2 is in communication with the second trench TR2. In some embodiments, the second via opening OP2 penetrates through the semiconductor substrate 222 and further extends into the second interconnect structure 124. For example, a portion of the dielectric layer 1241 is removed so that at least a portion of the metallization pattern 1242 is accessibly exposed by the second via opening OP2. It is noted that the illustration of the second via opening OP2 is merely an example, the number of the second via opening OP2 construe no limitation in the disclosure, and the second via opening OP2 may expose any level of the metallization patterns 1242 depending on the design requirements.

For example, the removal step may include one or more etching processes, such as wet etching, dry etching, or other etching techniques. In some embodiments, etching depths are controlled (e.g., by controlling the etching time) to obtain predetermined depths of the first via opening OP1 and the second via opening OP2. The etch stop layer (not shown) may be formed to provide a mechanism to stop the etching when forming the trenches and via openings. In some embodiments, one or more etch stop layers (not shown) are formed between adjacent layers, e.g., the dielectric material layer 140A and the insulating material layer 130A, the dielectric material layer 140A and the semiconductor substrate 222, the semiconductor substrate 222 and the dielectric layer 1241, and the dielectric layer 1241 and the metallization patterns 1242. The etch stop layers may be formed of a dielectric material having a different etch selectivity from the adjacent layers. The processes of forming the first trench TR1, the first via opening OP1, and the second trench TR2 may be similar to the processes described in FIG. 1D.

The process of forming the second via opening OP2 may be performed during the same step of forming the second trench TR2. In some alternative embodiments, the second via opening OP2 is formed after forming the second trench TR2. In some embodiments, the inner sidewalls of the second semiconductor die 220 that define the second via opening OP2 are substantially vertical. Alternatively, the second via opening OP2 may be essentially tapered toward the metallization pattern 1242 exposed by the second via opening OP2. The width W1 of the first via opening OP1 may be greater than the width W2 of the second via opening OP2. The depth D1 of the first via opening OP1 may also be greater than the depth D2 of the second via opening OP2. For example, an aspect ratio of depth D2 over the width W2 is less than or substantially equal to 10.

Continue to FIG. 2B, after forming the first trench TR1, the second trench TR2, the first via opening OP1, and the second via opening OP2, an isolating liner 230 is formed on portions of the rear surface 222b of the semiconductor substrate 222 that are exposed by the first trench TR1 and/or the second trench TR2. The material of the isolating liner 230 may be or may include silicon nitride, an oxide, silicon oxynitride, silicon carbide, or the like, and may be formed by any suitable method such as spin-coating, CVD, PECVD, HDP-CVD, ALD, or the like. Since the isolating liner 230 is formed after patterning the dielectric layer 140, the sidewalls of the isolating liner 230 may be in direct contact with the inner sidewalls of the dielectric layer 140.

The isolating liner 230 may be formed on the rear surface 222b of the semiconductor substrate 222 and continuously extend into the second via opening OP2 to line with the inner sidewalls 222s of the semiconductor substrate 222 and the inner sidewalls 1241s of the dielectric layer 1241. At least a portion of the top surface 1242*t* of the metallization pattern 1242 exposed by the second via opening OP2 may be exposed by the isolating liner 230. In some embodiments in which the first trench TR1 extends to expose the rear surface 222*b* of the semiconductor substrate 222, the isolating liner 230 may be formed on the rear surface 222*b* of the semiconductor substrate 222. In some other embodiments, the isolating liner 230 formed on the rear surface 222*b* of the semiconductor substrate 222 extends to cover the top surface 130*t* of the insulating layer 130. The isolating liner 230 may further extend into the first via opening OP1 to line with the inner sidewalls 130*s* of the insulating layer 130. At least a portion of the second bonding pad 1183 of the semiconductor wafer 110W corresponding to the first via opening OP1 may be exposed by the isolating liner 230.

Figure 2C:
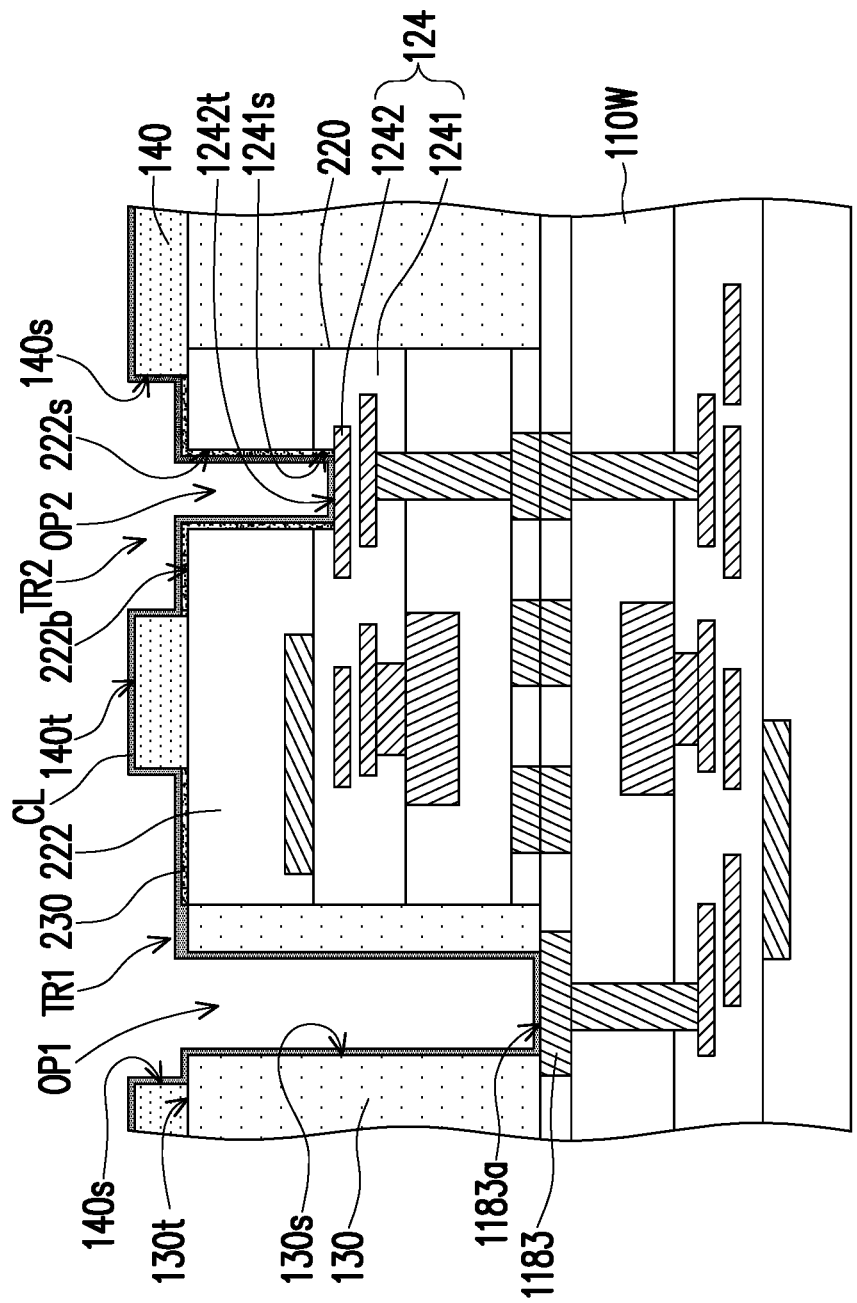
Figure 2D:
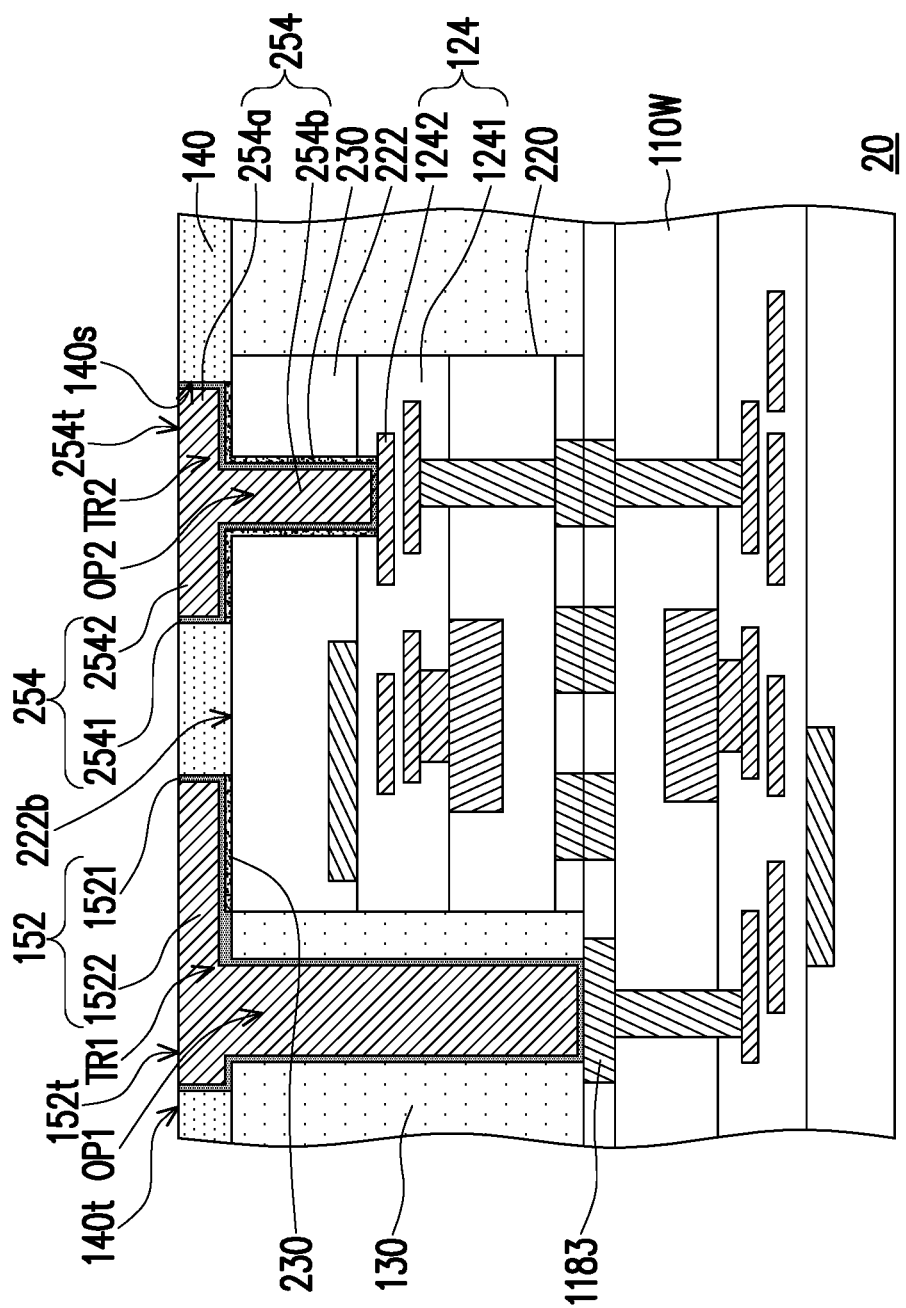

Referring to FIGS. 2C-2D, the first die connector 152 is formed in the first trench TR1 and the first via opening OP1 in communication with the first trench TR1, and a second die connector 254 is formed in the second trench TR2 and the second via opening OP2 in communication with the second trench TR2. For example, the conductive liner CL is conformally formed on the semiconductor wafer 110W, the second semiconductor die 220, the insulating layer 130, and the dielectric layer 140. For example, the conductive liner CL covers the top surface 140*t* of the dielectric layer 140 and also conformally covers the surfaces that define the first trench TR1, the second trench TR2, the first via opening OP1, and the second via opening OP2. The material and the forming process of the conductive liner CL may be similar to those of the conductive liner CL described in FIG. 1E, so the detailed descriptions are omitted for simplicity.

In some embodiments, the conductive liner CL is in physical contact with the surfaces that form the first trench TR1 and the first via opening OP1 (e.g., the top surface 1183*a* of the second bonding pad 1183, the inner sidewalls 130*s* of the insulating layer 130, the top surface 130*t* of the insulating layer 130, and the inner sidewalls 140*s* of the dielectric layer 140). In some embodiments, the conductive liner CL may also cover the isolating liner 230 formed on the rear surface 222*b* of the semiconductor substrate 222. In other embodiments in which the first trench TR1 doesn't expose the rear surface 222*b* of the semiconductor substrate 222, the conductive liner CL formed on the top surface 130*t* of the insulating layer 130 does not extend to form on the second semiconductor die 220.

In some embodiments, the conductive liner CL is in physical contact with the surfaces that form the second trench TR2 and the second via opening OP2 (e.g., the inner sidewalls 140*s* of the dielectric layer 140, the top surface 130*t* of the insulating layer 130, the inner sidewalls 222*s* of the semiconductor substrate 222, the inner sidewalls 1241*s* of the dielectric layer 1241, and the top surface 1242*t* of the metallization pattern 1242). In some embodiments, the conductive liner CL may also cover the isolating liner 230 formed on the rear surface 222*b* of the semiconductor substrate 222. The isolating liner 230 may be physically interposed between the semiconductor substrate 222 and the conductive liner CL. The conductive liner CL may cover the top surface 1242*t* of the metallization pattern 1242 on which the isolating liner 230 is not formed. In other embodiments in which the second trench TR1 doesn't expose the top surface 130*t* of the insulating layer 130, the conductive liner CL formed over the semiconductor substrate 222 does not extend to cover the insulating layer 130. It is appreciated that the illustration of FIG. 2C is merely an example and more or fewer surfaces defining the trenches and via openings may be covered by the conductive liner CL.

Continue to FIG. 2D, after forming the conductive liner CL, the conductive material may be formed on the conductive liner CL and fill the openings (e.g., the first trench TR1, the second trench TR2, the first via opening OP1, and the second via opening OP2). The material and the forming process of the conductive material may be similar to the conductive material described related to FIG. 1F, so the detailed descriptions are omitted for simplicity. In some embodiments, excess conductive material and the underlying conductive liner CL are removed from the top surface 140*t* of the dielectric layer 140 to form the first die connector 152 and the second die connector 254 by, for example, CMP or other suitable planarization techniques. In some embodiments, the top surface 152*t* of the first die connector 152 and the top surface 254*t* of the second die connector 254 are substantially leveled with the top surface 140*t* of the dielectric layer 140.

The first die connector 152 including the conductive material layer 1522 and the underlying conductive liner layer 1521 may be similar to the first die connector 152 described in FIG. 1F. The isolating liner 230 may be physically interposed between the rear surface 222*b* of the semiconductor substrate 222 and the conductive liner layer 1521 of the first die connector 152, so that the first die connector 152 is not in direct contact with the semiconductor substrate 222. The second die connector 254 including the conductive material layer 2542 and the underlying conductive liner layer 2541 may be electrically connected to the second semiconductor die 220. For example, the conductive liner layer 2541 is physically interposed between and electrically connected to the conductive material layer 2542 and the metallization pattern 1242. The conductive liner layer 2541 may be physically interposed between the isolating liner 230 and the conductive material layer 2542, so that the second die connector 254 is not in direct contact with the semiconductor substrate 222. The conductive liner layer 2541 lining with the inner sidewalls 140*s* of the dielectric layer 120 may be physically interposed between the dielectric layer 140 and the conductive material layer 2542. In some embodiments, the second die connector 254 includes a first portion 254*a* and a second portion 254*b* connecting the first portion 254*a* to the metallization pattern 1242 of the second interconnect structure 124.

Still referring to FIG. 2D, the first portion 254*a* of the second die connector 254 may be laterally covered by the dielectric layer 140, and the second portion 254*b* of the second die connector 254 may be laterally covered by the isolating liner 230 formed in the second semiconductor die 220. In some embodiments, the first portion 152*a* of the first die connector 152 and the first portion 254*a* of the second die connector 254 spatially separated by the dielectric layer 140 may be viewed as a conductive pattern. In some embodiments, the second portion 254*b* of the second die connector 254 extends into the second semiconductor die 220 from the rear surface 222*b* of the semiconductor substrate 222 to reach the metallization pattern 1242 of the second interconnect structure 124. The TSV of the second semiconductor die 220 may be replaced with the second portion 254*b* of the second die connector 254. The second die connector 254 and the first die connector 152 may be viewed as dual damascene connectors. In some embodiments, the first portion 254*a* and the second portion 254*b* of the second die connector 254 actually form integrated regions, with no visible interfaces (e.g., a barrier layer, a seed layer, etc.) therebetween. By such configuration, electrical resistance may be reduced and electrical performance may be improved.

Figure 2E:
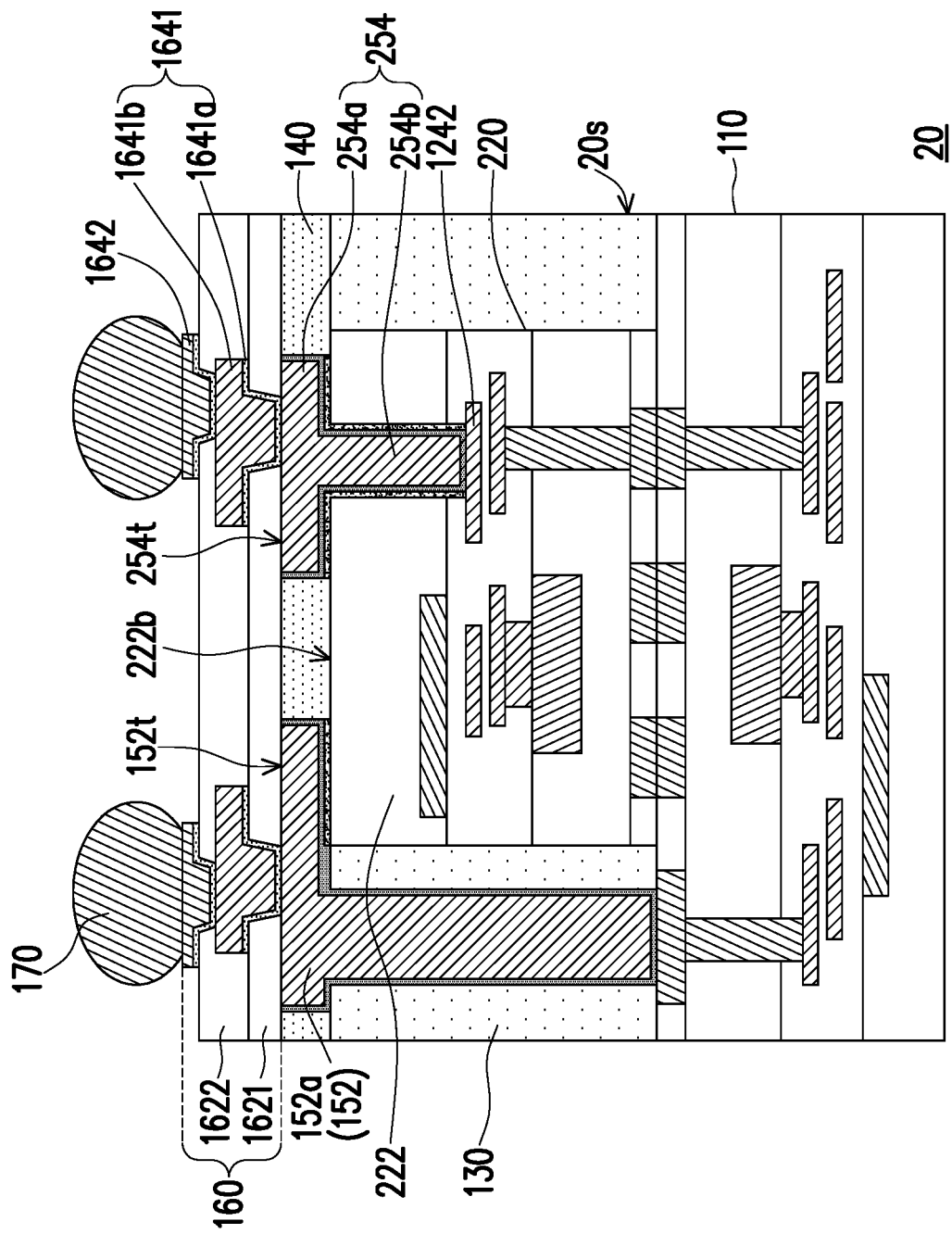

Referring to FIG. 2E, the redistribution structure 160 including the patterned dielectric layer (e.g., 1621 and 1622) and the patterned conductive layer (e.g., 1641 and 1642) may be formed on the dielectric layer 140, the first die connector 152, and the second die connector 254. For example, the patterned conductive layer 1641 is in physical and electrical contact with the top surface 152t of the first die connector 152 and the top surface 254t of the second die connector 254. The patterned conductive layer 1641 may include the seed material pattern 1641a and the overlying conductive material layer 1641b. In some embodiments, the seed material pattern 1641a is physically interposed between and electrically connected to the conductive material layer 1641b and the first portion 254a of the second die connector 254, and between the conductive material layer 1641b and the first portion 152a of the first die connector 152. Next, the conductive terminals 170 may be formed on the redistribution structure 160. Subsequently, the singulation process may be performed to separate the resulting structure into a plurality of individual semiconductor structures 20. The materials and the forming processes of the redistribution structure 160 and the conductive terminals 170 may be similar to those of the redistribution structure 160 and the conductive terminals 170 described in FIG. 1G, so the detailed descriptions are omitted for simplicity.

As shown in FIG. 2E, after the singulation process, the redistribution structure 160, the underlying dielectric layer 140, the underlying insulating layer 130, and the first semiconductor die 110 may have substantially coterminous sidewalls 20s. The semiconductor structure 20 may be similar to the semiconductor structure 10 described in FIG. 1G, except the second die connector 254 and the isolating liner 230. For example, the isolating liner 230 is at least formed on a portion of the rear surface 222b of the semiconductor substrate 222 that is not covered by the dielectric layer 140 to separate the first portion 152a of the first die connector 152 and the first portion 254a of the second die connector 254. The isolating liner 230 may extend into the second semiconductor die 220 to separate the second portion 254b of the second die connector 254 from the second semiconductor die 220. In some other embodiments, the isolating liner 230 is interposed between the rear surface 222b of the semiconductor substrate 222 and the dielectric layer 140. The first portion 254a of the second die connector 254 may be physically and electrically connected to redistribution structure 160, and the second portion 254b of the second die connector 254 is physically and electrically connected to the metallization pattern 1242 of the second interconnect structure 124. The first portion 254a and the second portion 254b of the second die connector 254 may be formed in the same formation process, so that the first portion 254a may form a continuous region with the underlying second portion 254b. Thus, no interface forms between first portion 254a and the second portion 254b. In this manner, the process steps and the processing cost of the semiconductor structure 20 may be reduced. The electrical interfaces between the second semiconductor die 220 and the redistribution structure 160 may be reduced by forming the second die connector 254, and thus electrical performance and interconnect reliability may be improved.

FIGS. 3A-3D are schematic cross-sectional views showing various stages in a manufacturing method of a semiconductor structure according to some embodiments. Throughout the various views and illustrative embodiments of the disclosure, like reference numbers are used to designate like elements. Unless specified otherwise, the materials and the formation methods of the elements described herein are essentially the same as the like elements described in FIGS. 1A-1G.

Figure 3A:
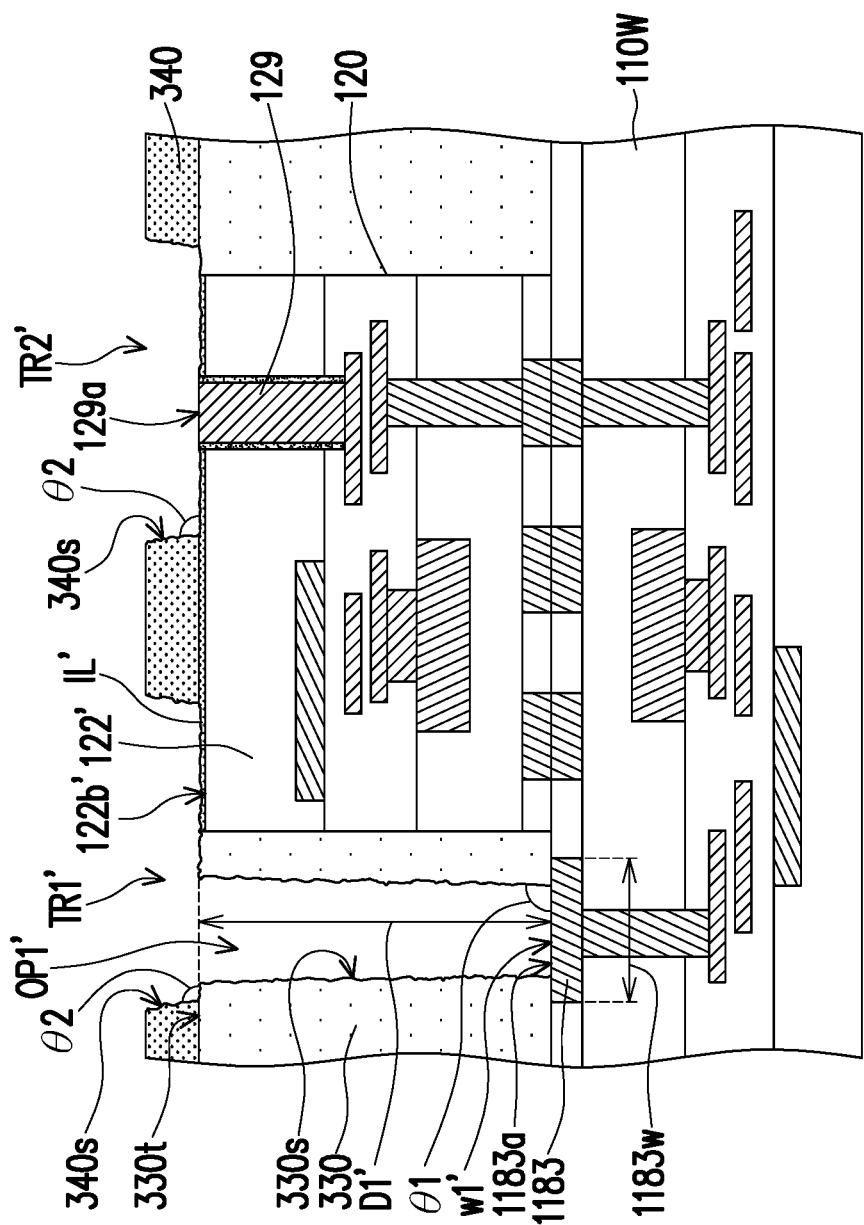
FIGS. 3A-3D are schematic cross-sectional views showing various stages in a manufacturing method of a semiconductor structure according to some embodiments.

Referring to FIG. 3A, the second semiconductor die 120 is bonded to the semiconductor wafer 110W, and then the insulating layer 330 is formed on the semiconductor wafer 110W to laterally cover the second semiconductor die 120. The TSV 129 of the second semiconductor die 120 may be accessibly exposed by the insulating layer 330. The dielectric layer 340 may be formed on the insulating layer 330 and the second semiconductor die 120. In some embodiments, at least a portion of the second bonding pad 1183 of the semiconductor wafer 110W is accessibly exposed by the first via opening OP1' of the insulating layer 330 which is in communication with the first trench TR1' of the dielectric layer 340. In some embodiments, at least a portion of the TSV 129 is accessibly exposed by the second trench TR2' of the dielectric layer 340.

In some embodiments, the insulating layer 330 includes polymer materials such as polybenzoxazole (PBO), polyimide (PI), benzocyclobutene (BCB), a combination thereof, or the like, and may be formed using spin-on coating or the like. In some embodiments, the insulating layer 330 is a molding compound, epoxy, or the like, and may be formed by compression molding, transfer molding, or the like. In some embodiments, the insulating layer 330 may be a polymer with or without a silica-based or glass filler added. The planarization process is optionally performed to level the top surface 330t of the insulating layer 330 and the rear surface 122b' of the semiconductor substrate 122' before forming the dielectric layer 340. The TSV 129 of the second semiconductor die 120 may be accessibly revealed after the planarization process. In some embodiments, the second semiconductor substrate 122' is slightly etched, and then the isolating liner IL' is formed on the rear surface 122b' of the semiconductor substrate 122' to laterally cover the TSV 129 before forming the dielectric layer 340.

In some embodiments, the dielectric layer 340 may be or may include polymer materials such as PBO, PI, BCB, a combination thereof, or the like. The materials of the dielectric layer 340 and the underlying insulating layer 330 may be the same or similar. In some alternative embodiments, the dielectric layer 340 includes materials such as silicon oxide, silicon nitride, silicon carbide, silicon oxynitride, a combination thereof, or the like. In some embodiments, by forming the dielectric layer 340 and/or the insulating layer 330 as a low temperature cured polymer material, a thermal budget for the overall manufacture may be reduced.

Continue to FIG. 3A, in some embodiments, the dielectric material layer is formed on the insulating material layer, the isolating liner IL, and the TSV 129. Next, the dielectric material layer and the insulating material layer may be patterned (e.g., using laser drilling) to form the first trench TR1', the second trench TR2', and the first via opening OP1'. In some embodiments in which the first trench TR1', the second trench TR2', and the first via opening OP1' are formed by laser drilling, the surfaces that define the first trench TR1', the second trench TR2', and the first via opening OP1' have significant roughness, compared with the surfaces formed by etching. As surface roughness is known that provides a measure of the unevenness of the surface height. In some embodiments, the surface roughness of the exposed surface 129a of the TSV 129 is less than that of the inner sidewalls 340s of the dielectric layer 340. The surface roughness of the exposed surface 129a of the TSV 129 may be less than that of the isolating liner IL' formed on the rear surface 122b' of the semiconductor substrate 122' and exposed by the second trench TR2'. In some embodiments, the surface roughness of the inner sidewalls 330s of the insulating layer 330 is greater than that of the top surface 1183a of the second bonding pad 1183.

In some embodiments in which the laser drilling is performed, the first trench TR1, the second trench TR2' and the first via opening OP1 may be slightly tapered toward the semiconductor wafer 110W. The first trench TR1', the second trench TR2', and/or the first via opening OP1' may have a wide top and narrow bottom profile. For example, the inner sidewalls 330s of the insulating layer 330 are inclined relative to the top surface 1183a of the second bonding pad 1183. In some embodiments, a first angle θ1 formed between the top surface 1183a of the second bonding pad 1183 and the inner sidewall 330s of the insulating layer 330 may be an obtuse angle. For example, the inner sidewalls 340s of the dielectric layer 340 are inclined relative to the rear surface 122b' of the semiconductor substrate 122' and/or the top surface 330t of the insulating layer 330. Alternatively, the first angle θ1 may be close to a right angle. In some embodiments, a second angle θ2 formed between the rear surface 122b' of the semiconductor substrate 122' and the inner sidewall 340s of the dielectric layer 340 connected to the rear surface 122b' (or between the top surface 330t of the insulating layer 330 and the inner sidewall 340s of the dielectric layer 340 connected to the top surface 330t) may be an obtuse angle. Alternatively, the second angle θ2 may be substantially a right angle. The width (or diameter) W1' of the first via opening OP1' may be less than the width (or diameter) 1183w of the second bonding pad 1183. The width W1' may be a maximum width of the first via opening OP1' or a minimum width of the first via opening OP1'. For example, the width W1' of the first via opening OP1' ranges from about 2 μm to about 5 μm. In some embodiments, a difference is between the width 1183w of the second bonding pad 1183 and the width W1' of the first via opening OP1'. The width 1183w of the second bonding pad 1183 may range from about 4 μm to about 7 μm in accordance with some embodiments. The difference of the widths (1183w and W1') is, for example, about 5 μm. Alternatively, the difference of the widths (1183w and W1') may be greater than or less than 5 μm, depending on the accuracy of laser drilling.

Figure 3B:
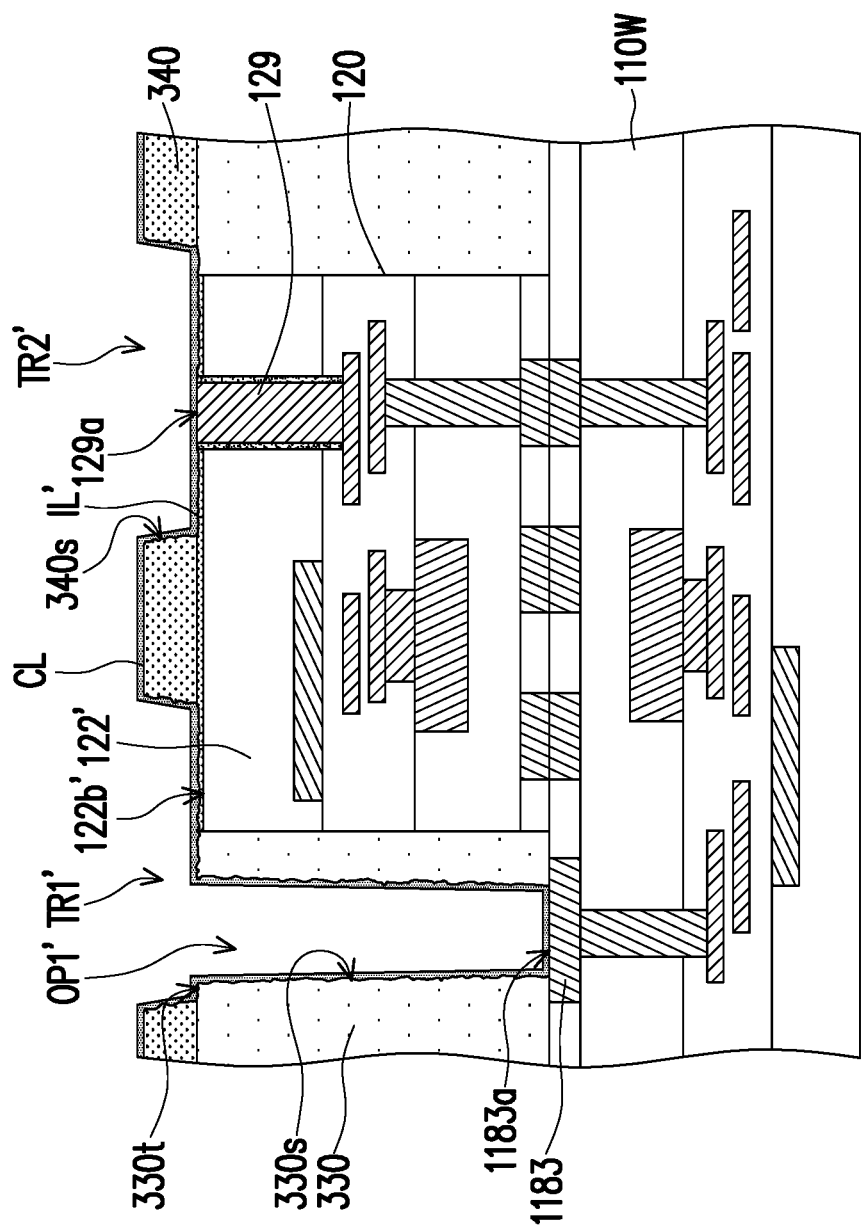

Referring to FIG. 3B and also with reference to FIG. 3A, the conductive liner CL is formed on the resulting structure shown in FIG. 3A. For example, the conductive liner CL covers the top surface 340t of the dielectric layer 340 and also conformally covers the surfaces that define the first trench TR1', the second trench TR2', and the first via opening OP1'. In some embodiments, the roughed inner sidewalls (330s and 340s) of the insulating layer 330 and the dielectric layer 340 are covered by the conductive liner CL. In some embodiments, the conductive liner CL also covers the uneven topography of the top surface 330t of the insulating layer 330. The conductive liner CL may further cover the uneven topography of the isolating liner IL' formed on the rear surface 122b' of the semiconductor substrate 122. The material and the forming process of the conductive liner CL may be similar to those of the conductive liner CL described in FIG. 1E, so the detailed descriptions are not repeated for simplicity.

Figure 3C:
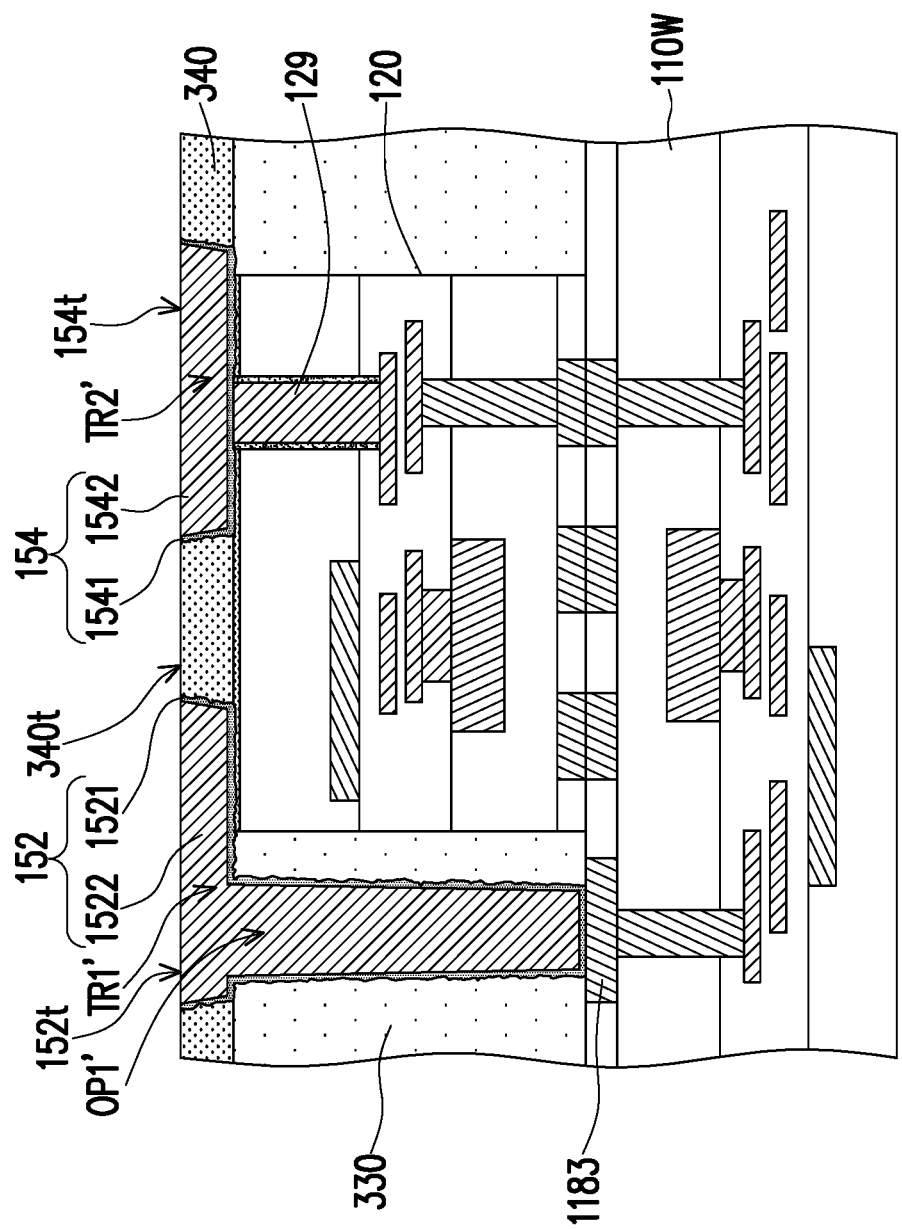

Referring to FIG. 3C, the conductive material may be formed on the conductive liner CL and fill the first trench TR1', the first via opening OP1', and the second trench TR2'. Subsequently, excess conductive material and the underlying conductive liner CL may be removed from the top surface 340t of the dielectric layer 340 to form the first die connector 152 and the second die connector 154. For example, the planarization process is performed to level the top surface 340t of the dielectric layer 340, the top surface 152t of the first connector 152, and the top surface 154t of the second die connector 154. For example, the first die connector 152 including the conductive material layer 1522 and the underlying conductive liner layer 1521 may be electrically connected to the second bonding pad 1183. The conductive liner layer 1521 may be physically interposed between and electrically connected to the conductive material layer 1522 and the second bonding pad 1183. The second die connector 154 including the conductive material layer 1542 and the underlying conductive liner layer 1541 may be electrically connected to the TSV 129. The conductive liner layer 1541 may be physically interposed between and electrically connected to the TSV 129 and the conductive material layer 1542. The forming processes and the materials of the first die connector 152 and the second die connector 154 may be similar to those of the first die connector 152 and the second die connector 154 described in FIG. 1F, so the detailed descriptions are omitted for the sake of brevity.

Figure 3D:
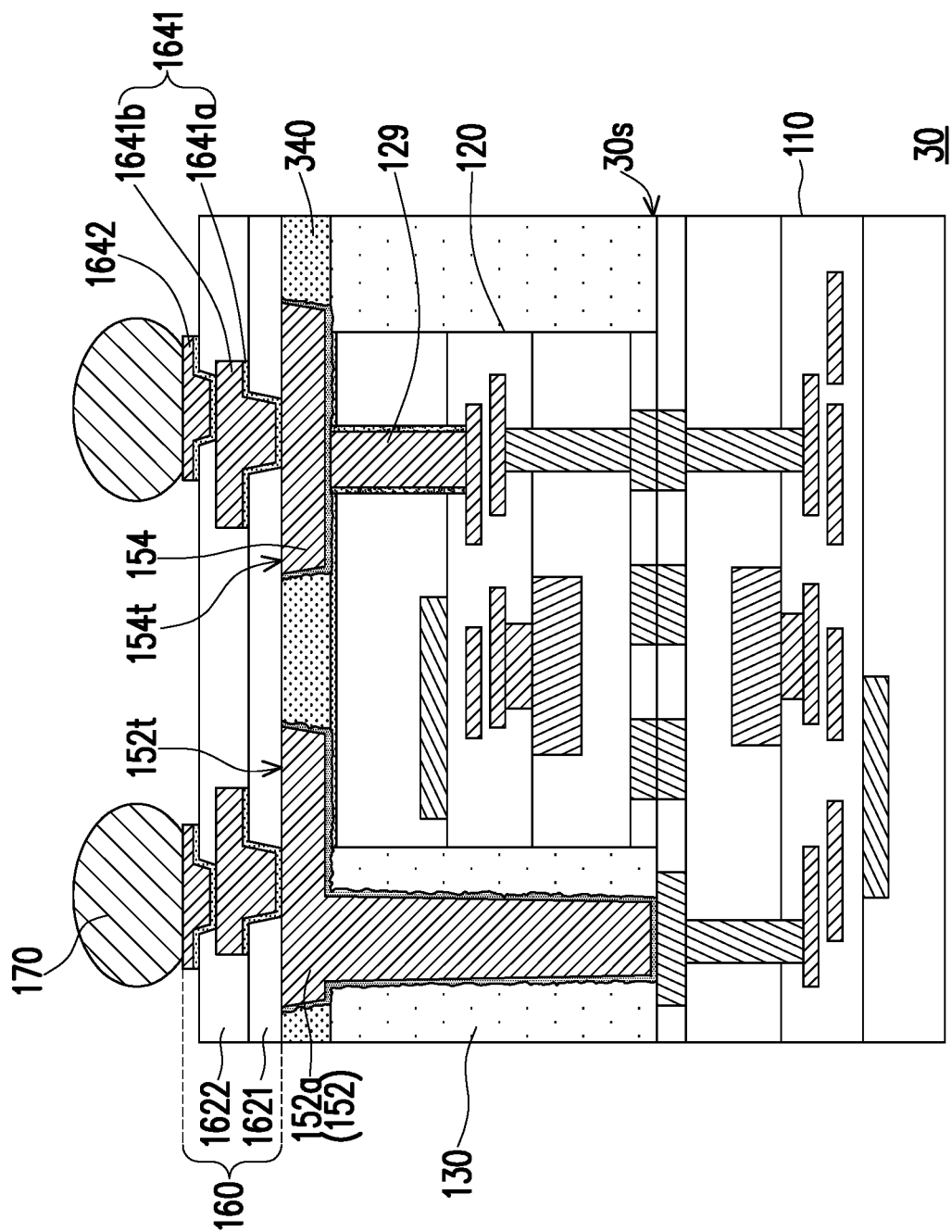

Referring to FIG. 3D, the redistribution structure 160 including the patterned dielectric layer (e.g., 1621 and 1622) and the patterned conductive layer (e.g., 1641 and 1642) may be formed on the dielectric layer 340, the first die connector 152, and the second die connector 154. For example, the patterned conductive layer 1641 is in physical and electrical contact with the top surface 152t of the first die connector 152 and the top surface 154t of the second die connector 154. The patterned conductive layer 1641 may include the seed material pattern 1641a and the overlying conductive material layer 1641b. In some embodiments, the seed material pattern 1641a is physically interposed between and electrically connected to the conductive material layer 1641b and the first portion 152a of the first die connector 152, and between the conductive material layer 1641b and the second die connector 154.

Next, the conductive terminals 170 may be formed on the redistribution structure 160. Subsequently, the singulation process may be performed to separate the resulting structure into a plurality of individual semiconductor structures 30. The materials and the forming processes of the redistribution structure 160 and the conductive terminals 170 may be similar to those of the redistribution structure 160 and the conductive terminals 170 described in FIG. 1G, so the detailed descriptions are omitted for simplicity. As shown in FIG. 3D, after the singulation process, the redistribution structure 160, the underlying dielectric layer 340, the underlying insulating layer 330, and the first semiconductor die 110 may have substantially coterminous sidewalls 30s.

Figure 4A:
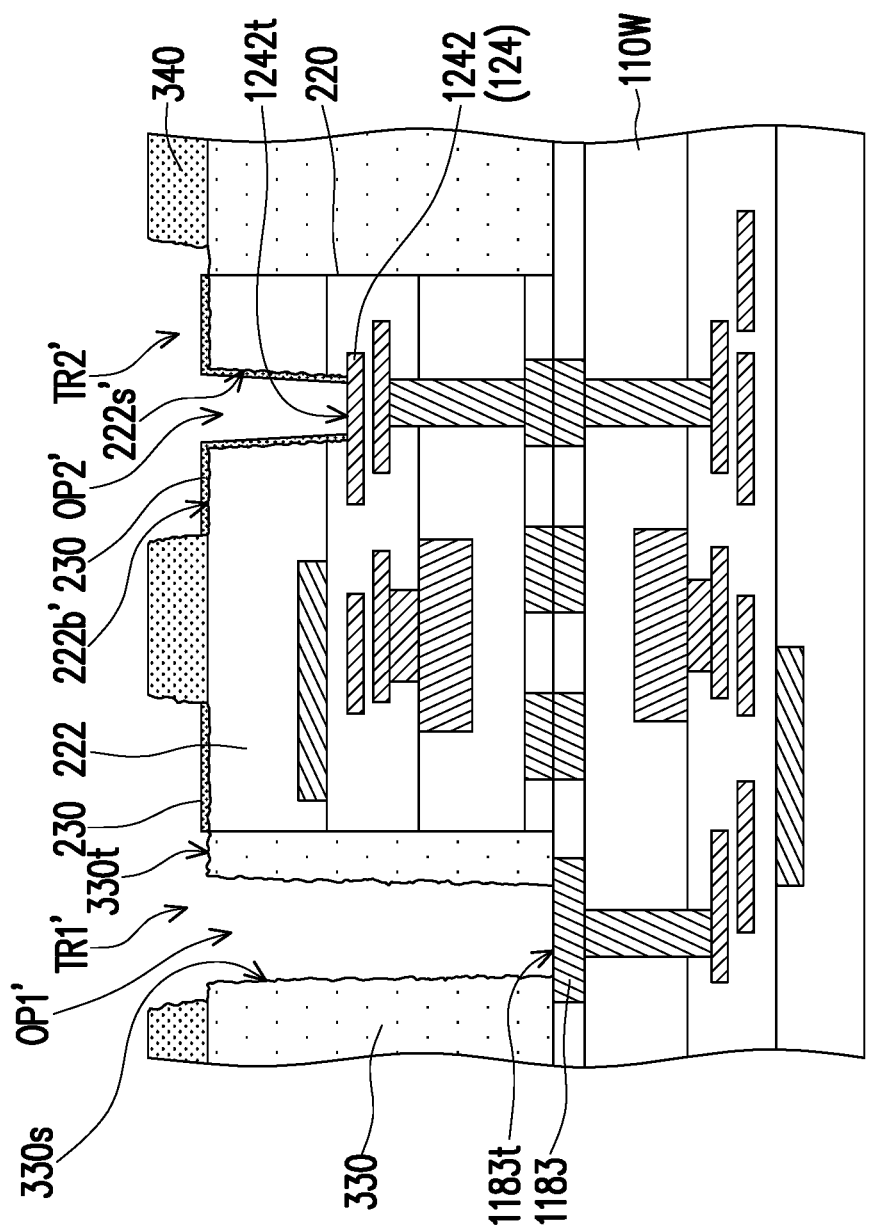
FIGS. 4A-4C are schematic cross-sectional views showing various stages in a manufacturing method of a semiconductor structure according to some embodiments.
Figure 4B:
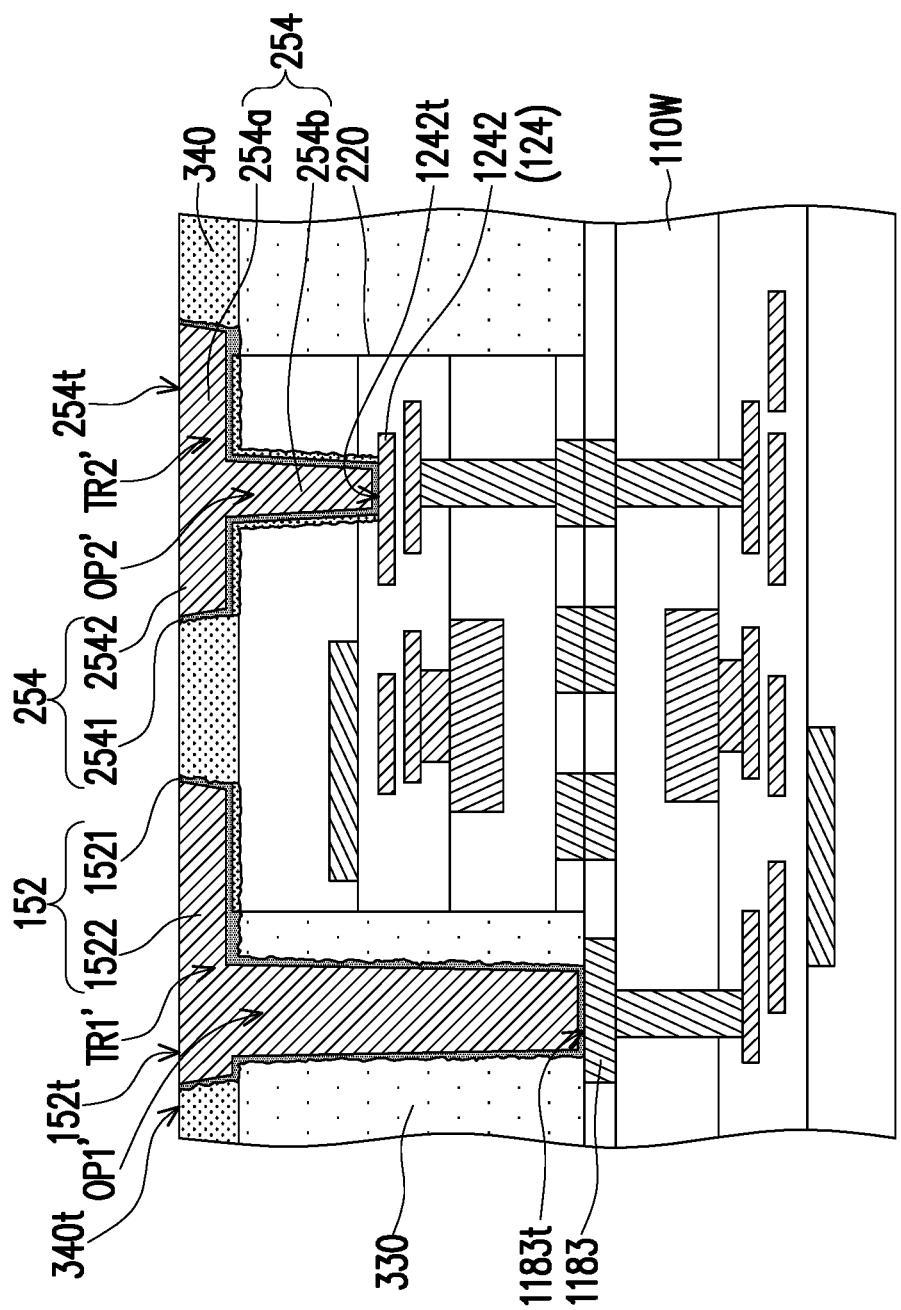
Figure 4C:
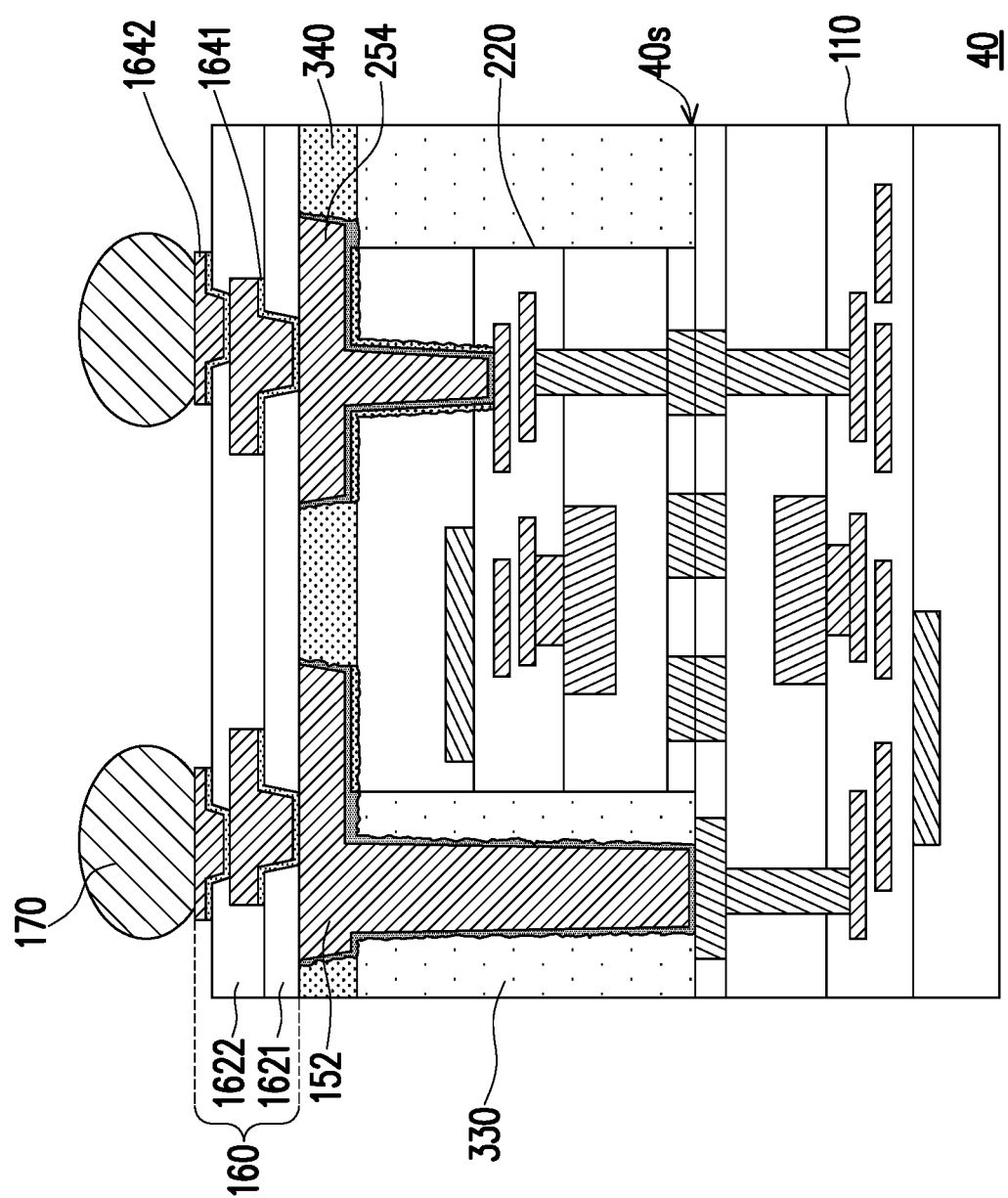

FIGS. 4A-4C are schematic cross-sectional views showing various stages in a manufacturing method of a semiconductor structure according to some embodiments. Throughout the various views and illustrative embodiments of the disclosure, like reference numbers are used to designate like elements. Unless specified otherwise, the materials and the formation methods of the elements described herein are essentially the same as the like elements described in FIGS. 2A-2E and 3A-3D.

Referring to FIG. 4A, the structure shown in FIG. 4A may be similar to the structure shown in FIG. 2B, except that a different process is employed to form the trenches (e.g., TR1' and TR2') and the via openings (e.g., OP1' and OP2'). For example, the semiconductor die is bonded to the semiconductor wafer 110W, and then the insulating material layer and the dielectric material layer are sequentially formed. The bonding process and the forming process may be similar to the processes described in FIG. 2A, so the detailed descriptions are not repeated for the sake of brevity. Subsequently, a removal process (e.g., laser drilling) is performed on the dielectric material layer, the insulating material layer, and the semiconductor die to respectively form the dielectric layer 340 having the first trench TR1' and the second trench TR2', the insulating layer 330 having the first via opening OP1', and the second semiconductor die 220 having the second via opening OP2'. The first via opening OP1' of the insulating layer 330 is in communication with the first trench TR1' of the dielectric layer 340 and may accessibly expose the second bonding pad 1183 of the semiconductor wafer 110W. The second via opening OP2' of the second semiconductor die 220 is in communication with the second trench TR2' of the dielectric layer 340 and may accessibly expose the metallization pattern 1242 of the second interconnect structure 124.

Continue to FIG. 4A, the structure shown in FIG. 4A may be similar to the structure shown in FIG. 3A, except that the second semiconductor die 220 is free of TSV and the second via opening OP2' is formed during the step of forming the second trench TR2'. In some embodiments, the dielectric layer 340, the insulating layer 330, and the second semiconductor die 220 may have roughed surfaces after the laser drilling process. For example, the surface roughness of the inner sidewalls 222s' of the semiconductor substrate 222 is greater than that of the top surface 1242t of the metallization pattern 1242. In some embodiments, the second via opening OP2' has a tapered profile. For example, the inner sidewalls 222s' of the semiconductor substrate 222 are sloped from the rear surface 222b' of the semiconductor substrate 222 toward the metallization pattern 1242. Alternatively, the inner sidewalls 222s' of the semiconductor substrate 222 are substantially vertical to the rear surface 222b'.

Still referring to FIG. 4A, the isolating liner 230 is formed on portions of the rear surface 222b' of the semiconductor substrate 222 that are exposed by the first trench TR1' and/or the second trench TR2'. The roughed rear surface 222b' of the semiconductor substrate 222 is then covered by the isolating liner 230. The isolating liner 230 may be formed on the rear surface 222b' of the semiconductor substrate 222 and extend into the second via opening OP2' to line with the inner sidewalls 222s' of the semiconductor substrate 222. In some embodiments in which the first trench TR1' extends to expose the rear surface 222b' of the semiconductor substrate 222, the isolating liner 230 is formed on the rear surface 222b' of the semiconductor substrate 222. In some other embodiments, the isolating liner 230 formed on the rear surface 222b' of the semiconductor substrate 222 extends to cover the top surface 330t of the insulating layer 330. In some other embodiments, the isolating liner 230 may further extend into the first via opening OP1' to line with the inner sidewalls 130s of the insulating layer 130. The material and the forming process of the isolating liner 230 may be similar to the isolating liner 230 described in FIG. 2B.

Referring to FIG. 4B, the first die connector 152 including the conductive material layer 1522 and the underlying conductive liner layer 1521, and the second die connector 254 including the conductive material layer 2542 and the underlying conductive liner layer 2541 are formed. The first die connector 152 and the second die connector 254 may be formed during the same step, and may be similar to the first die connector 152 and the second die connector 254 described in FIG. 2D. For example, the conductive liner is conformally formed in the trenches and the via openings, and then the conductive material is formed on the conductive liner and fills the trenches and the via openings. Subsequently, the planarization process is optionally performed to remove excess conductive material and the conductive liner to level the top surface 340t of the dielectric layer 340, the top surface 152t of the first die connector 152, and the top surface 254t of the second die connector 254. The conductive liner layer 1521 of the first die connector 152 and the conductive liner layer 2541 of the second die connector 254 may cover the roughed surfaces caused by the laser drilling process. The conductive liner layer 1521 of the first die connector 152 overlying the top surface 1183t of the second bonding pad 1183 may be physically interposed between and electrically connected to the second bonding pad 1183 and the conductive material layer 1522. The conductive liner layer 2541 of the second die connector 254 overlying the top surface 1242t of the metallization pattern 1242 may be physically interposed between and electrically connected to the metallization pattern 1242 and the conductive material layer 2542.

Referring to FIG. 4C, the redistribution structure 160 including the patterned dielectric layer (e.g., 1621 and 1622) and the patterned conductive layer (e.g., 1641 and 1642) may be formed on the dielectric layer 340, the first die connector 152, and the second die connector 254. Next, the conductive terminals 170 may be formed on the redistribution structure 160. Subsequently, the singulation process may be performed to separate the resulting structure into a plurality of individual semiconductor structures 40. The materials and the forming processes of the redistribution structure 160 and the conductive terminals 170 may be similar to those of the redistribution structure 160 and the conductive terminals 170 described in FIG. 1G, so the detailed descriptions are omitted for simplicity. As shown in FIG. 4C, after the singulation process, the redistribution structure 160, the underlying dielectric layer 340, the underlying insulating layer 330, and the first semiconductor die 110 may have substantially coterminous sidewalls 40s.

Figure 5:
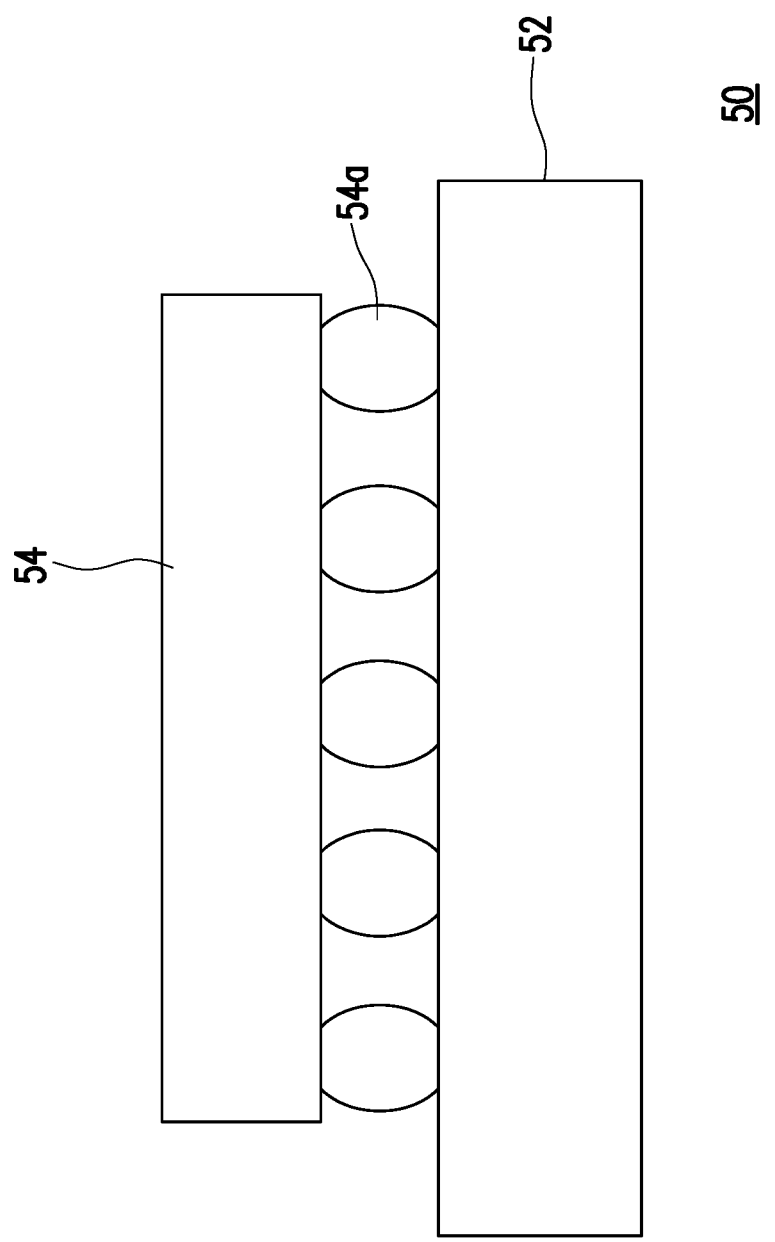
FIG. 5 is a schematic cross-sectional view showing an application of a semiconductor structure according to some embodiments.

FIG. 5 is a schematic cross-sectional view showing an application of a semiconductor structure according to some embodiments. Referring to FIG. 5, a package structure 50 including a first component 52 and a second component 54 disposed over the first component 52 is provided. The first component 52 may be or may include a printed circuit board (PCB), a printed wiring board, an interposer, a package substrate, and/or other carrier that is capable of carrying integrated circuits. The second component 54 mounted on the first component 52 may be similar to any one of the semiconductor structures described in FIGS. 1G, 2E, 3D, and 4C. In some embodiments, more than one the semiconductor structures (e.g., any combination of the semiconductor structures described above) may be electrically coupled to the first component 52 through a plurality of terminals 54a. In some embodiments, the terminals 54a are the conductive terminals 170 described above, and a reflow process may be performed on the conductive terminals 170 to mount the semiconductor structure(s) on the first component 52.

The semiconductor structure described above may be or may be a part of an Integrated-Fan-Out (InFO) package, a Chip-On-Wafer-On-Substrate (CoWoS) package, a Chip-On-Wafer (CoW) package, etc. For example, the second component 54 mounted on the first component 52 may be the InFO package including at least one semiconductor structure (e.g., any one or combination of the semiconductor structures described above) packaged therein. For example, the second component 54 includes the semiconductor structures separately and laterally encapsulated by a molding layer (not shown). The second component 54 may further include a fan-out redistribution structure (not shown) formed on the molding layer and the semiconductor structures, and the fan-out redistribution structure may be electrically coupled to the semiconductor structures through the conductive terminals 170. A plurality of external terminals 54*a* of the second component 54 may be formed on the fan-out redistribution structure to be electrically coupled to the first component 52 and the semiconductor structures. Other packaging techniques may be used to form the package structure 50, which are not limited in the disclosure. The package structure 50 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

In accordance with some embodiments, a semiconductor structure includes a first semiconductor die, a second semiconductor die, an insulating layer, and a first dual-damascene connector. The first semiconductor die includes a first bonding surface including a die attaching region and a peripheral region connected to the die attaching region. The second semiconductor die is electrically connected to the first semiconductor die, and a second bonding surface of the second semiconductor die is bonded to the first bonding surface in the die attaching region. The insulating layer is disposed on the first bonding surface in the peripheral region and extends along sidewalls of the second semiconductor die. The first dual-damascene connector is electrically connected to the first semiconductor die, a first portion of the first dual-damascene connector is disposed on the insulating layer, and a second portion of the first dual-damascene connector penetrates through the insulating layer and lands on the first bonding surface of the first semiconductor die in the peripheral region.

In accordance with some embodiments, a semiconductor structure includes a first semiconductor die, a second semiconductor die, an insulating layer, a first die connector, and a second die connector. The second semiconductor die is electrically connected to the first semiconductor die through bonding pads of the first semiconductor die and second semiconductor die. The insulating layer is disposed on the first semiconductor die and laterally covers the second semiconductor die. The first die connector is electrically connected to the first semiconductor die, a first portion of the first die connector is disposed on the insulating layer, a second portion of the first die connector includes a continuous region with the overlying first portion of the first die connector, and the second portion of the first die connector penetrates through the insulating layer to connect the first semiconductor die. The second die connector is electrically connected to the second semiconductor die, a first portion of the second die connector is disposed on a semiconductor substrate of the second semiconductor die, a second portion of the second die connector includes a continuous region with the overlying first portion of the second die connector, and the second portion penetrates through the semiconductor substrate of the second semiconductor die.

In accordance with some embodiments, a manufacturing method of a semiconductor structure includes at least the following steps. An insulating material layer is formed on a bonding surface of a semiconductor wafer to cover a semiconductor die that is bonded to the semiconductor wafer. A dielectric material layer is formed on the insulating material layer and the semiconductor die. A portion of the dielectric material layer, a portion of the insulating material layer, and a portion of the semiconductor die are removed to respectively form a dielectric layer with a first trench and a second trench, an insulating layer with a first via opening, and a treated semiconductor die with a second via opening. The first via opening of the insulating layer in communication with the first trench of the dielectric layer accessibly reveals a portion of the bonding surface of the semiconductor wafer. The second via opening of the treated semiconductor die in communication with the second trench of the dielectric layer accessibly reveals a portion of an interconnect circuitry of the treated semiconductor die. Conductive materials are formed in the first trench and the second trench of the dielectric layer, the first via opening of the insulating layer, and the second via opening of the treated semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first semiconductor die comprising a first bonding surface comprising a die attaching region and a peripheral region connected to the die attaching region;
    a second semiconductor die electrically connected to the first semiconductor die, a second bonding surface of the second semiconductor die being bonded to the first bonding surface in the die attaching region;
    an insulating layer disposed on the first bonding surface in the peripheral region and extending along sidewalls of the second semiconductor die; and
    a first dual-damascene connector electrically connected to the first semiconductor die, a first portion of the first dual-damascene connector being disposed on the insulating layer, a second portion of the first dual-damascene connector penetrating through the insulating layer and landing on the first bonding surface of the first semiconductor die in the peripheral region.

2. The semiconductor structure of claim 1, wherein an inner sidewall of the insulating layer covering the second portion of the first dual-damascene connector comprises a surface roughness greater than a surface roughness of the first bonding surface of the first semiconductor die.

3. The semiconductor structure of claim 1, further comprising:
    a second dual-damascene connector electrically connected to the second semiconductor die, a first portion of the second dual-damascene connector being disposed on a semiconductor substrate of the second semiconductor die, a second portion of the second dual-damascene connector penetrating through the semiconductor substrate and landing on an interconnect circuitry of the second semiconductor die.

4. The semiconductor structure of claim 3, wherein the second dual-damascene connector comprises:
    a conductive liner layer lining with an inner sidewall of the semiconductor substrate, a rear surface of the semiconductor substrate connected to the inner sidewall of the semiconductor substrate, and the interconnect circuitry; and a conductive material layer overlying the conductive liner layer.

5. The semiconductor structure of claim 3, wherein an inner sidewall of the semiconductor substrate of the second semiconductor die covering the second portion of the second dual-damascene connector comprises a surface roughness greater than a surface roughness of the interconnect circuitry of the second semiconductor die.

6. The semiconductor structure of claim 3, further comprising:

an isolating liner interposed between the semiconductor substrate of the second semiconductor die and the second dual-damascene connector.

7. The semiconductor structure of claim 3, further comprising:

a dielectric layer disposed on the insulating layer and a portion of the semiconductor substrate of the second semiconductor die to laterally cover the first portion of the first dual-damascene connector and the first portion of the second dual-damascene connector; and an isolating liner disposed on another portion of the semiconductor substrate of the second semiconductor die unmasked by the dielectric layer and separating the semiconductor substrate from the second dual-damascene connector.

8. A semiconductor structure, comprising:

a first semiconductor die;

a second semiconductor die electrically connected to the first semiconductor die through bonding pads of the first semiconductor die and second semiconductor die;

an insulating layer disposed on the first semiconductor die and laterally covering the second semiconductor die;

a first die connector electrically connected to the first semiconductor die, a first portion of the first die connector being disposed on the insulating layer, a second portion of the first die connector comprising a continuous region with the overlying first portion of the first die connector, and the second portion of the first die connector penetrating through the insulating layer to connect the first semiconductor die; and a second die connector electrically connected to the second semiconductor die, a first portion of the second die connector being disposed on a semiconductor substrate of the second semiconductor die, a second portion of the second die connector comprising a continuous region with the overlying first portion of the second die connector, and the second portion of the second die connector penetrating through the semiconductor substrate of the second semiconductor die.

9. The semiconductor structure of claim 8, wherein an inner sidewall of the insulating layer covering the second portion of the first die connector comprises a surface roughness greater than a surface roughness of the bonding pads of the first semiconductor die.

10. The semiconductor structure of claim 9, wherein the second portion of the second die connector extending through the semiconductor substrate and lands on an interconnect circuitry of the second semiconductor die that is between the bonding pads of the second semiconductor die and the semiconductor substrate.

11. The semiconductor structure of claim 8, further comprising:

an isolating liner interposed between the semiconductor substrate of the second semiconductor die and the second die connector.

12. The semiconductor structure of claim 11, wherein the isolating liner covers a surface of the semiconductor substrate of the second semiconductor die that has a surface roughness greater than a surface roughness of the bonding pads of the first semiconductor die.

13. The semiconductor structure of claim 8, wherein the second die connector comprises:

a conductive material layer; and a conductive liner layer lining with a via opening of the second semiconductor die and extending over a rear surface of the second semiconductor die opposite to the first semiconductor die, and the conductive liner layer interposed between the conductive material layer and the second semiconductor die.

14. The semiconductor structure of claim 8, further comprising:

a polymer layer disposed on the insulating layer and the second semiconductor die, the polymer layer separating the first portion of the first die connector from the first portion of the second die connector, and a surface roughness of an inner sidewall of the polymer layer being greater than a surface roughness of the bonding pads of the first semiconductor die.

15. A manufacturing method of a semiconductor structure, comprising:

forming an insulating material layer on a bonding surface of a semiconductor wafer to cover a semiconductor die that is bonded to the semiconductor wafer;

forming a dielectric material layer on the insulating material layer and the semiconductor die;

removing a portion of the dielectric material layer, a portion of the insulating material layer, and a portion of the semiconductor die to respectively form a dielectric layer with a first trench and a second trench, an insulating layer with a first via opening, and a treated semiconductor die with a second via opening, wherein:

the first via opening of the insulating layer in communication with the first trench of the dielectric layer accessibly reveals a portion of the bonding surface of the semiconductor wafer, and the second via opening of the treated semiconductor die in communication with the second trench of the dielectric layer accessibly reveals a portion of an interconnect circuitry of the treated semiconductor die; and forming conductive materials in the first trench and the second trench of the dielectric layer, the first via opening of the insulating layer, and the second via opening of the treated semiconductor die.

16. The manufacturing method of claim 15, further comprising:

bonding each of a plurality of bonding pads of the semiconductor die to one of a plurality of bonding pads of the semiconductor wafer before forming the insulating material layer.

17. The manufacturing method of claim 15, wherein removing the portion of the dielectric material layer, the portion of the insulating material layer, and the portion of the semiconductor die by an etching process.

18. The manufacturing method of claim 15, wherein forming the conductive materials comprises:

forming a conductive liner on the dielectric layer, the insulating layer, the bonding surface of the semiconductor wafer, and the treated semiconductor die;

forming a conductive material layer on the conductive liner to fill the first trench, the first via opening, the second trench, and the second via opening; and leveling the conductive liner and the conductive material layer with a major surface of the dielectric layer.

19. The manufacturing method of claim 15, wherein removing the portion of the dielectric material layer, the portion of the insulating material layer, and the portion of the semiconductor die comprises:

roughening surfaces of the dielectric material layer, the insulating material layer, and the semiconductor die that form the first trench, the second trench, the first via opening, and the second via opening.

20. The manufacturing method of claim 19, further comprising:

forming an isolating liner on a semiconductor substrate of the treated semiconductor die that is accessibly revealed by the second trench of the dielectric layer and the second via opening of the treated semiconductor die before forming the conductive materials.

* * * * *